(12) United States Patent
den Boer et al.

(10) Patent No.: US 8,076,571 B2
(45) Date of Patent: *Dec. 13, 2011

(54) FRONT ELECTRODE FOR USE IN PHOTOVOLTAIC DEVICE AND METHOD OF MAKING SAME

(75) Inventors: Willem den Boer, Brighton, MI (US); Yiwei Lu, Ann Arbor, MI (US); David Broadway, Northville, MI (US); Bryce Corsner, Seneca Falls, NY (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/232,619

(22) Filed: Sep. 19, 2008

(65) Prior Publication Data
US 2009/0084438 A1    Apr. 2, 2009

Related U.S. Application Data

(63) Continuation-in-part of application No. 12/149,263, filed on Apr. 29, 2008, now Pat. No. 7,964,788, and a continuation-in-part of application No. 12/068,117, filed on Feb. 1, 2008, and a continuation-in-part of application No. 11/984,092, filed on Nov. 13, 2007, and a continuation-in-part of application No. 11/987,664, filed on Dec. 3, 2007, and a continuation-in-part of application No. 11/898,641, filed on Sep. 13, 2007, and a continuation-in-part of application No. 11/591,668, filed on Nov. 2, 2006, and a continuation-in-part of application No. 11/790,812, filed on Apr. 27, 2007.

(51) Int. Cl.
*H01L 31/00* (2006.01)

(52) U.S. Cl. ........ 136/265; 136/252; 136/260; 136/256; 136/258; 136/261; 136/264

(58) Field of Classification Search ............... 136/243, 136/256, 252, 260, 258, 261, 265, 264
See application file for complete search history.

(56) References Cited

U.S. PATENT DOCUMENTS
3,411,934 A    11/1968    Englehart et al.
(Continued)

FOREIGN PATENT DOCUMENTS
DE    40 00 664    7/1991
(Continued)

OTHER PUBLICATIONS

Mathew et al. "CdTe/CdS solar cells on flexible substrates". Solar Energy 77 (2004) 831-838.*

(Continued)

*Primary Examiner* — Basia Ridley
*Assistant Examiner* — Lindsey Bernier
(74) *Attorney, Agent, or Firm* — Nixon & Vanderhye P.C.

(57) ABSTRACT

This invention relates to a front electrode/contact for use in an electronic device such as a photovoltaic device. In certain example embodiments, the front electrode of a photovoltaic device or the like includes a multilayer coating including at least one transparent conductive oxide (TCO) layer (e.g., of or including a material such as tin oxide, ITO, zinc oxide, or the like) and/or at least one conductive substantially metallic IR reflecting layer (e.g., based on silver, gold, or the like). In certain example instances, the multilayer front electrode coating may include one or more conductive metal(s) oxide layer(s) and/or one or more conductive substantially metallic IR reflecting layer(s) in order to provide for reduced visible light reflection, increased conductivity, cheaper manufacturability, and/or increased infrared (IR) reflection capability.

9 Claims, 17 Drawing Sheets

U.S. PATENT DOCUMENTS

| | | | |
|---|---|---|---|
| 3,804,491 | A | 4/1974 | Morokuma et al. |
| 4,155,781 | A | 5/1979 | Diepers |
| 4,162,505 | A | 7/1979 | Hanak |
| 4,163,677 | A | 8/1979 | Carlson et al. |
| 4,213,798 | A | 7/1980 | Williams et al. |
| 4,378,460 | A | 3/1983 | Williams |
| 4,532,373 | A | 7/1985 | Matsuura et al. |
| 4,554,727 | A | 11/1985 | Deckman et al. |
| 4,598,306 | A | 7/1986 | Nath et al. |
| 4,663,495 | A | 5/1987 | Berman et al. |
| 4,664,748 | A | 5/1987 | Ueno et al. |
| 4,689,438 | A | 8/1987 | Fukatsu et al. |
| 4,931,412 | A * | 6/1990 | Fischer et al. ............ 438/71 |
| 4,940,495 | A | 7/1990 | Weber et al. |
| 5,073,451 | A | 12/1991 | Iida et al. |
| 5,091,764 | A | 2/1992 | Asaoka et al. |
| 5,110,637 | A | 5/1992 | Ando et al. |
| 5,131,954 | A | 7/1992 | Vogeli et al. |
| 5,171,411 | A | 12/1992 | Hillendahl et al. |
| 5,183,700 | A | 2/1993 | Austin |
| 5,230,746 | A | 7/1993 | Wiedeman et al. |
| 5,256,858 | A | 10/1993 | Tomb |
| 5,326,519 | A | 7/1994 | Claussen |
| 5,589,403 | A | 12/1996 | Toyama et al. |
| 5,603,778 | A | 2/1997 | Sonoda |
| 5,650,019 | A | 7/1997 | Yamada et al. |
| 5,667,853 | A | 9/1997 | Fukuyoshi et al. |
| 5,699,035 | A | 12/1997 | Ito et al. |
| 5,861,189 | A | 1/1999 | Sheel et al. |
| 5,891,556 | A | 4/1999 | Anderson et al. |
| 5,964,962 | A | 10/1999 | Sannomiya et al. |
| 6,048,621 | A | 4/2000 | Gallego et al. |
| 6,123,824 | A | 9/2000 | Sano et al. |
| 6,187,824 | B1 | 2/2001 | Swank |
| 6,288,325 | B1 | 9/2001 | Jansen et al. |
| 6,344,608 | B2 | 2/2002 | Kariya et al. |
| 6,365,823 | B1 * | 4/2002 | Kondo ............ 136/246 |
| 6,380,480 | B1 | 4/2002 | Norimatsu et al. |
| 6,406,639 | B2 | 6/2002 | Sakaguchi et al. |
| 6,433,913 | B1 | 8/2002 | Bauer et al. |
| 6,469,438 | B2 | 10/2002 | Fukuoka et al. |
| 6,506,622 | B1 | 1/2003 | Shiozaki |
| 6,613,603 | B1 | 9/2003 | Sano |
| 6,627,322 | B2 | 9/2003 | Choi et al. |
| 6,686,050 | B2 | 2/2004 | Lingle et al. |
| 6,746,775 | B1 | 6/2004 | Boire et al. |
| 6,747,779 | B1 | 6/2004 | Morin et al. |
| 6,784,361 | B2 | 8/2004 | Carlson et al. |
| 6,825,409 | B2 | 11/2004 | Haussler et al. |
| 6,827,970 | B2 | 12/2004 | Varanasi et al. |
| 6,844,210 | B2 | 1/2005 | Fukuoka et al. |
| 6,852,555 | B1 | 2/2005 | Roman et al. |
| 6,933,672 | B2 | 8/2005 | Hosokawa |
| 6,936,347 | B2 | 8/2005 | Laird et al. |
| 6,963,168 | B2 | 11/2005 | Eida et al. |
| 6,963,383 | B2 | 11/2005 | Tokailin et al. |
| 6,972,750 | B2 | 12/2005 | Yu |
| 6,975,067 | B2 | 12/2005 | McCormick et al. |
| 6,979,414 | B2 | 12/2005 | Hosokawa |
| 6,987,547 | B2 | 1/2006 | Yang et al. |
| 6,989,280 | B2 | 1/2006 | Ko |
| 7,012,728 | B2 | 3/2006 | Morin et al. |
| 7,037,869 | B2 | 5/2006 | Landa et al. |
| 7,087,834 | B2 | 8/2006 | McFarland |
| 7,090,921 | B2 | 8/2006 | Stachowiak |
| 7,132,666 | B2 | 11/2006 | Nakata et al. |
| 7,141,863 | B1 | 11/2006 | Compaan et al. |
| 7,144,837 | B2 | 12/2006 | Landa et al. |
| 7,153,579 | B2 | 12/2006 | Kriltz et al. |
| 7,169,722 | B2 | 1/2007 | Landa et al. |
| 7,317,237 | B2 | 1/2008 | Niira et al. |
| 2002/0001724 | A1 | 1/2002 | Anderson et al. |
| 2002/0008192 | A1 | 1/2002 | Isomura |
| 2003/0011047 | A1 | 1/2003 | Cunningham et al. |
| 2003/0064255 | A1 | 4/2003 | Dannenberg |
| 2003/0165693 | A1 | 9/2003 | Hartig et al. |
| 2003/0218153 | A1 | 11/2003 | Abe |
| 2004/0038051 | A1 | 2/2004 | Fujisawa et al. |
| 2004/0086723 | A1 * | 5/2004 | Thomsen et al. ............ 428/426 |
| 2004/0113146 | A1 | 6/2004 | Dahmani |
| 2004/0187914 | A1 | 9/2004 | Matsuda et al. |
| 2004/0241457 | A1 | 12/2004 | Macquart et al. |
| 2004/0244829 | A1 | 12/2004 | Rearick et al. |
| 2005/0016583 | A1 | 1/2005 | Blieske et al. |
| 2005/0042460 | A1 | 2/2005 | Kriltz |
| 2005/0208319 | A1 * | 9/2005 | Finley et al. ............ 428/545 |
| 2005/0257824 | A1 | 11/2005 | Maltby et al. |
| 2005/0258029 | A1 | 11/2005 | Muller et al. |
| 2006/0065299 | A1 | 3/2006 | Fukawa et al. |
| 2006/0099441 | A1 | 5/2006 | Teyssedre et al. |
| 2006/0169316 | A1 | 8/2006 | Thomsen et al. |
| 2006/0219988 | A1 | 10/2006 | Abe |
| 2006/0228564 | A1 | 10/2006 | Demiryont |
| 2006/0248923 | A1 | 11/2006 | Krasnov et al. |
| 2006/0249199 | A1 | 11/2006 | Thomsen et al. |
| 2006/0289055 | A1 | 12/2006 | Sridharan et al. |
| 2007/0029187 | A1 | 2/2007 | Krasnov |
| 2007/0120045 | A1 | 5/2007 | Yokoyama |
| 2007/0184573 | A1 | 8/2007 | Krasnov |
| 2007/0193624 | A1 | 8/2007 | Krasnov |
| 2007/0209698 | A1 | 9/2007 | Thomsen et al. |
| 2007/0215205 | A1 | 9/2007 | Thomsen et al. |
| 2008/0047602 | A1 | 2/2008 | Krasnov |
| 2008/0047603 | A1 | 2/2008 | Krasnov |
| 2008/0105293 | A1 | 5/2008 | Lu et al. |
| 2008/0105298 | A1 | 5/2008 | Lu et al. |
| 2008/0105299 | A1 | 5/2008 | Krasnov |
| 2008/0105302 | A1 * | 5/2008 | Lu et al. ............ 136/258 |
| 2008/0107799 | A1 | 5/2008 | Lu et al. |
| 2008/0163929 | A1 | 7/2008 | Krasnov |
| 2008/0169021 | A1 | 7/2008 | Krasnov |
| 2008/0178932 | A1 | 7/2008 | Den Boer et al. |
| 2008/0210303 | A1 * | 9/2008 | Lu et al. ............ 136/260 |
| 2008/0223430 | A1 | 9/2008 | Krasnov et al. |
| 2008/0223436 | A1 | 9/2008 | den Boer et al. |
| 2008/0302414 | A1 * | 12/2008 | den Boer et al. ............ 136/256 |
| 2008/0308145 | A1 | 12/2008 | Krasnov et al. |
| 2008/0308146 | A1 | 12/2008 | Krasnov et al. |
| 2008/0308151 | A1 * | 12/2008 | Den Boer et al. ............ 136/256 |
| 2009/0126791 | A1 | 5/2009 | Lu et al. |
| 2009/0194155 | A1 | 8/2009 | den Boer et al. |
| 2009/0194157 | A1 | 8/2009 | den Boer et al. |

FOREIGN PATENT DOCUMENTS

| | | |
|---|---|---|
| DE | 19713215 | 8/1998 |
| DE | 19958878 | 6/2001 |
| DE | 10 2006 062 092 | 7/2008 |
| EP | 0 137 291 | 4/1985 |
| EP | 0 180 222 | 5/1986 |
| EP | 0 204 562 | 12/1986 |
| EP | 0 252 489 | 1/1988 |
| EP | 0 309 000 | 3/1989 |
| EP | 372929 A2 * | 6/1990 |
| EP | 0 403 936 | 12/1990 |
| EP | 0 436 741 | 7/1991 |
| EP | 0 567 735 | 11/1993 |
| EP | 0 721 112 | 7/1996 |
| EP | 0 969 518 | 1/2000 |
| EP | 987774 A2 * | 3/2000 |
| EP | 0 991 129 | 5/2000 |
| EP | 1 056 136 | 11/2000 |
| EP | 1 063 317 | 12/2000 |
| EP | 1 115 160 | 11/2001 |
| EP | 1 174 397 | 1/2002 |
| EP | 1 300 889 | 4/2003 |
| EP | 1 343 176 | 9/2003 |
| EP | 1 343 177 | 9/2003 |
| FR | 2551267 | 3/1985 |
| FR | 2 911 336 | 7/2008 |
| GB | 2188924 | 10/1987 |
| GB | 2 405 030 | 2/2005 |
| JP | 57-049265 | 3/1982 |
| JP | 61-141185 | 6/1986 |
| JP | 61-278171 | 12/1986 |
| JP | 62-179165 | 8/1987 |
| JP | 02-106978 | 4/1990 |
| JP | 2164077 | 6/1990 |

| | | |
|---|---|---|
| JP | 7122764 | 5/1995 |
| JP | 11-298030 | 10/1999 |
| JP | 2001-36117 | 2/2001 |
| WO | WO 94/25397 | 11/1994 |
| WO | WO 98/47702 | 10/1998 |
| WO | WO 03/019598 | 3/2003 |
| WO | WO 03/048060 | 6/2003 |
| WO | WO 2006/029073 | 3/2006 |
| WO | WO 2007/034110 | 3/2007 |
| WO | WO 2008/036769 | 3/2008 |
| WO | WO 2008/063305 | 5/2008 |
| WO | WO 2008/154128 | 12/2008 |

OTHER PUBLICATIONS

U.S. Appl. No. 12/149,263 filed Apr. 29, 2008, den Boer et al.
"Improved Transparent Conductive Oxide/p$^+$/i Junction in Amorphous Silicon Solar Cells by Tailored Hydrogen Flux During Growth", Nuruddin et al., Thin Solid Films 394 (2001) pp. 49-63.
"Work Function Determination of Zinc Oxide Films", Sundaram et al., J. Vac. Sci. Technol. A. 15(2), Mar./Apr. 1997, pp. 428-430.
"Optoelectronic Properties of Thin Amorphous and Micro-Crystalline P-Type Films Developed for Amorphous Silicon-Based Solar Cells", Winz et al., Materials Research Society Symposium Proceedings vol. 420, Apr. 1996.
"Investigation of Indium Tin Oxide/Zinc Oxide Multilayer Ohmic Contacts to n-Type GaN Isotype Conjunction", Lee et al., Applied Physics Letters, vol, 78, No. 22, May 28, 2001, pp. 3412-3414.
"The Insert of Zinc Oxide Thin Film in Indium Tin Oxide Anode for Organic Electroluminescence Devices", Jeong et al., Current Applied Physics4 (2004) 655-658.
"Improved Fill Factors in Amorphous Silicon Solar Cells on Zinc Oxide by Insertion of a Germanium Layer to Block Impurity Incorporation", Ganguly et al., Applied Physics Letters, vol. 85, No. 3, Jul. 19, 2004, pp. 479-481.
Improvement in Quantum Efficiency of Thin Film Si Solar Cells Due to the Suppression of Optical Reflectance at Transparent Conducting Oxide/Si Interface by $TiO_2$/ZnO Antireflection Coating, Fujibayashi et al., Applied Physics Letters 88, (2006) (2pgs).
"Thin-Film Compound Semiconductor Photovoltaics", Shafarman et al., Materials Research Society, vol. 865, Mar. 29-Apr. 1, 2005.
P2-39 Soda Lime Glass as a Substrate for TFT-LCDs, Uchikoga et al., Japan Display '89, Oct. 16-18, pp. 426-429.
U.S. Appl. No. 11/507,660, filed Aug. 22, 2006, Krasnov.
U.S. Appl. No. 11/509,094, filed Aug. 24, 2006, Krasnov.
U.S. Appl. No. 11/984,092, filed Nov. 13, 2007, den Boer et al.
"Numerical Modelling of Rear Junction SI Solar Cells Using Fermi-Dirac Statistics", Harder et al., FEIT-Engineering Australian National University, ACT 0200 (4pgs).
"Large-Area Deposition for Crystalline Silicon on Glass Modules", Basore, 3$^{rd}$ World Conference on Photovoltaic Energy Conversion, May 2003, (pp. 1-4).
"Physical Properties of Natively Textured Yttrium Doped Zinc Oxide Films by Sol-Gel", Kaur et al., Journal of Materials Science: Materials in Electronics 16 (2005) pp. 649-655.
"Highly Transparent and Conductive Rare Earth Doped ZnO Thin Films Prepared by Magnetron Sputtering", Minami et al., Kanazawa Institute of Technology, Thin Solid Films, vol. 366, pp. 63-68, 2000.
"The Band Structure and Work Function of Transparent Conducting Aluminum and Maganese Co-Doped Zinc Oxide Films", Cao et al., ACTA Metallurgica Sinica (English Letters), vol. 18, No. 3, pp. 356-362, 2005.
"Al-Doped Zinc Oxide Films Deposited by Simultaneous fr and dc Excitation of a Magnetron Plasma: Relationships Between Plasma Parameters and Structural and Electrical Film Properties", Cebulla et al., J.Appl. Phys. 83 (2), Jan. 15, 1998.
"Novel Device Structure for Cu(In, Ga)Se2 Thin film Solar Cells Using Transparent Conducting Oxide Back and Front Contacts", Nakada et al., Solar Energy 77 (2004) 739-747.
"Improved Three-Dimensional Optical Model for Thin-Film Silicon Solar Cells", Springer et al., Journal of Applied Physics, vol. 96, No. 9, Nov. 1, 2004.
U.S. Appl. No. 11/600,912, filed Nov. 17, 2006.
"TCO and Light Trapping in Silicon Thin Film Solar Cells". Muller et al., Solar Energy 77 (2004) pp. 917-930.
"A Transparent Metal: Nb-Doped Anatase $TiO_2$", Furubayashi et al., Applied Physics Letters 86, (2005).
New Transparent Conductors Anatase Ti1-xMxO2 (M=Nb, Ta): Transport and Optical Properties, Furubayashi et al., Materials Research Society, vol. 905E, 2006.
"Transparent Conductors and Barrier Layers for Thin Film Solar Cells", Gordon et al., Final Technical Report Jun. 15, 2001.
"$TiO_2$-Coated TCO (SnO2:F) Films Prepared by AP-CVD with High Durability against Hydrogen Radicals". Kambe et al., 15$^{th}$ International Photovoltaic Science & Engineering Conference (PVSEC 15) China 2005.
"Self-Aligning, Industrially Feasible Back Contacted Silicon Solar Cells with Efficiencies >18%", Muller et al., 3$^{rd}$ World Conference on Photovoltaic Energy Conversion, May 11-18, 2003, Osaka, Japan.
"Role of the Glass/TCO Substrate in Thin film Silicon Solar Cells", Muller et al., WCPEC-3, Osaka, Japan, May 11-18, 2003.
"Enhancement of Light Trapping in Silicon Thin-Film Solar Cells by Optimizing From TCO and Back Reflector", Jeon et al. 15$^{th}$ Int. Photovoltaic Science & Engineering Conference, China, 2005.
"Recent Applications of Pulsed Lasers in Advanced Materials Processing", Booth, Thin Solid Films 453-454 (2004) pp. 450-457.
"TiN and TiO2:Nb Thin Film Preparation Using Hollow Cathode Sputtering with Application to Solar Cells", Guo et al., J. Vac. Sci. Technol. A 24(4) (Jul./Aug. 2006) pp. 1524-1529.
"Physical and Photoelectrochemical Properties of the TiO2-ZnO System", Yoon et al., Materials Research Bulletin, vol. 34, No. 9 (1999) pp. 1451-1461.
"Transparent Conducting Oxides (TCO's) for Amorphous Silicon Solar Cells", Hegedus et al., AIP Conf. Proc. vol. 353, No. 1 (1996) pp. 465-472.
"TiO2 Thin Films as Protective Material for Transparent-Conducting Oxides Used in Si Thin Film Solar Cells", Natsuhara et al., Solar Energy Materials & Solar Cells 90 (2006) pp. 2867-2880.
"Texture Etched ZnO:Al Coated Glass Substrates for Silicon Based Thin Film Solar Cells", Kluth et al., Thin Solid Films 351 (1999) pp. 247-253.
U.S. Appl. No. 11/591,668, filed Nov. 2, 2006.
U.S. Appl. No. 11/591,676, filed Nov. 2, 2006.
U.S. Appl. No. 11/650,564, filed Jan. 8, 2007.
U.S. Appl. No. 11/653,431, filed Jan. 16, 2007.
U.S. Appl. No. 11/717,787, filed Mar. 14, 2007.
U.S. Appl. No. 11/790,687, filed Apr. 26, 2007.
U.S. Appl. No. 11/790,812, filed Apr. 27, 2007.
U.S. Appl. No. 11/812,078, filed Jun. 14, 2007.
U.S. Appl. No. 11/808,765, filed Jun. 12, 2007.
U.S. Appl. No. 11/898,641, filed Sep. 13, 2007.
U.S. Appl. No. 11/987,664, filed Dec. 3, 2007.
U.S. Appl. No. 11/984,662, filed Nov. 20, 2007.
U.S. Appl. No. 12/068,117, filed Feb. 1, 2008.
U.S. Appl. No. 12/068,119, filed Feb. 1, 2008.
U.S. Appl. No. 12/149,263, filed Apr. 29, 2008.
U.S. Appl. No. 12/285,374, filed Oct. 2, 2008.
U.S. Appl. No. 12/285,890, filed Oct. 15, 2008.
International Search Report dated Dec. 16, 2010.
Partial European Search Report dated May 17, 2011.
Partial European Search Report mailed Aug. 1, 2011.

* cited by examiner

US 8,076,571 B2

FRONT ELECTRODE FOR USE IN PHOTOVOLTAIC DEVICE AND METHOD OF MAKING SAME

This application is a continuation-in-part (CIP) of each of U.S. Ser. Nos. 12/149,263, filed Apr. 29, 2008 now U.S. Pat. No. 7,964,788, 12/068,117, filed Feb. 1, 2008, 11/984,092, filed Nov. 13, 2007, 11/987,664, filed Dec. 3, 2007, 11/898,641, filed Sep. 13, 2007, 11/591,668, filed Nov. 2, 2006, and 11/790,812, filed Apr. 27, 2007, the entire disclosures of which are all hereby incorporated herein by reference.

Certain embodiments of this invention relate to a photovoltaic device including an electrode such as a front electrode/contact. In certain example embodiments of this invention, the front electrode is of or includes a transparent conductive coating (TCC) having a plurality of layers, and may be provided on a surface of a front glass substrate opposite to a patterned surface of the substrate. The TCC may act to enhance transmission in selected PV active regions of the visible and near IR spectrum, while substantially rejecting and/or blocking undesired IR thermal energy from certain other areas of the spectrum.

In certain example embodiments, the front electrode of the photovoltaic device includes a multi-layer coating (or TCC) having at least one infrared (IR) reflecting and conductive substantially metallic layer of or including silver, gold, or the like, and possibly at least one transparent conductive oxide (TCO) layer (e.g., of or including a material such as tin oxide, zinc oxide, or the like). In certain example embodiments, the multilayer front electrode coating is designed to realize one or more of the following advantageous features: (a) reduced sheet resistance and thus increased conductivity and improved overall photovoltaic module output power; (b) increased reflection of infrared (IR) radiation thereby reducing the operating temperature of the photovoltaic module so as to increase module output power; (c) reduced reflection and/or increased transmission of light in the region of from about 400-700 nm, 450-700 mm, and/or 450-600 nm, which leads to increased photovoltaic module output power; (d) reduced total thickness of the front electrode coating which can reduce fabrication costs and/or time; (e) improved or enlarged process window in forming the TCO layer(s) because of the reduced impact of the TCO's conductivity on the overall electric properties of the module given the presence of the highly conductive substantially metallic IR reflecting layer(s); and/or (f) reduced risk of thermal stress caused module breakage by reflecting solar thermal energy and reducing temperature difference across the module.

BACKGROUND AND SUMMARY OF EXAMPLE EMBODIMENTS OF INVENTION

Photovoltaic devices are known in the art (e.g., see U.S. Pat. Nos. 6,784,361, 6,288,325, 6,613,603, and 6,123,824, the disclosures of which are hereby incorporated herein by reference). Amorphous silicon photovoltaic devices, for example, include a front electrode or contact. Typically, the transparent front electrode is made of a pyrolytic transparent conductive oxide (TCO) such as zinc oxide or tin oxide formed on a substrate such as a glass substrate. In many instances, the transparent front electrode is formed of a single layer using a method of chemical pyrolysis where precursors are sprayed onto the glass substrate at approximately 400 to 600 degrees C. Typical pyrolitic fluorine-doped tin oxide TCOs as front electrodes may be about 400 nm thick, which provides for a sheet resistance ($R_s$) of about 15 ohms/square. To achieve high output power, a front electrode having a low sheet resistance and good ohm-contact to the cell top layer, and allowing maximum solar energy in certain desirable ranges into the absorbing semiconductor film, are desired.

Unfortunately, photovoltaic devices (e.g., solar cells) with only such conventional TCO front electrodes suffer from the following problems.

First, a pyrolitic fluorine-doped tin oxide TCO about 400 nm thick as the entire front electrode has a sheet resistance ($R_s$) of about 15 ohms/square which is rather high for the entire front electrode. A lower sheet resistance (and thus better conductivity) would be desired for the front electrode of a photovoltaic device. A lower sheet resistance may be achieved by increasing the thickness of such a TCO, but this will cause transmission of light through the TCO to drop thereby reducing output power of the photovoltaic device.

Second, conventional TCO front electrodes such as pyrolytic tin oxide allow a significant amount of infrared (IR) radiation to pass therethrough thereby allowing it to reach the semiconductor or absorbing layer(s) of the photovoltaic device. This IR radiation causes heat which increases the operating temperature of the photovoltaic device thereby decreasing the output power thereof.

Third, conventional TCO front electrodes such as pyrolytic tin oxide tend to reflect a significant amount of light in the region of from about 400-700 nm, or 450-700 nm, so that less than about 80% of useful solar energy reaches the semiconductor absorbing layer; this significant reflection of visible light is a waste of energy and leads to reduced photovoltaic module output power. Due to the TCO absorption and reflections of light which occur between the TCO (n about 1.8 to 2.0 at 550 nm) and the thin film semiconductor (n about 3.0 to 4.5), and between the TCO and the glass substrate (n about 1.5), the TCO coated glass at the front of the photovoltaic device typically allows less than 80% of the useful solar energy impinging upon the device to reach the semiconductor film which converts the light into electric energy.

Fourth, the rather high total thickness (e.g., 400 nm) of the front electrode in the case of a 400 nm thick tin oxide TCO, leads to high fabrication costs.

Fifth, the process window for forming a zinc oxide or tin oxide TCO for a front electrode is both small and important. In this respect, even small changes in the process window can adversely affect conductivity of the TCO. When the TCO is the sole conductive layer of the front electrode, such adverse affects can be highly detrimental.

Thus, it will be appreciated that there exists a need in the art for an improved front electrode for a photovoltaic device that can solve or address one or more of the aforesaid five problems.

In certain example embodiments of this invention, there is provided a front electrode structure for a photovoltaic device, the front electrode structure comprising: a front substantially transparent glass substrate; a first layer comprising one or more of silicon nitride, silicon oxide, silicon oxynitride, and/or tin oxide; a second layer comprising one or more of titanium oxide and/or niobium oxide, wherein at least the first layer is located between the front substrate and the second layer; a third layer comprising zinc oxide and/or zinc aluminum oxide; a conductive layer comprising silver, wherein at least the third layer is provided between the conductive layer comprising silver and the second layer; a layer comprising an oxide of Ni and/or Cr; a transparent conductive oxide (TCO) layer comprising indium tin oxide provided between the layer comprising the oxide of Ni and/or Cr and a transparent conductive oxide (TCO) layer comprising tin oxide; and wherein a layer stack comprising said first layer, said second layer, said third layer, said conductive layer comprising silver, said layer comprising the oxide of Ni and/or Cr, said TCO layer comprising indium tin oxide, and said TCO comprising tin oxide, is provided on an interior surface of the front glass substrate facing the semiconductor film of the photovoltaic device.

In certain example embodiments of this invention, there is provided a photovoltaic device including a front electrode structure, the front electrode structure comprising: a front substantially transparent glass substrate; a dielectric layer comprising titanium oxide; a dielectric layer comprising silicon oxynitride, wherein the layer comprising titanium oxide is located between the glass substrate and the layer comprising silicon nitride; a conductive layer comprising indium tin oxide, wherein the layer comprising silicon oxynitride is located between at least the layer comprising indium tin oxide and the layer comprising titanium oxide; a conductive layer comprising zinc oxide and/or zinc aluminum oxide; wherein the front electrode structure comprising said layer comprising titanium oxide, said layer comprising silicon oxynitride, said conductive layer comprising indium tin oxide, and said conductive layer comprising zinc oxide and/or zinc aluminum oxide is provided on an interior surface of the front glass substrate facing a semiconductor film of the photovoltaic device.

In certain example embodiments of this invention, the front electrode of a photovoltaic device includes a transparent conductive coating (TCC) having a plurality of layers, and is provided on a surface of a front glass substrate opposite to a patterned surface of the substrate. In certain example embodiments, the patterned (e.g., etched) surface of the front transparent glass substrate faces incoming light, whereas the TCC is provided on the opposite surface of the substrate facing the semiconductor film of the photovoltaic (PV) device. The patterned first or front surface of the glass substrate reduces reflection loss of incident solar flux and increases the absorption of photon(s) in the semiconductor film through scattering, refraction and diffusion.

In certain example embodiments, the TCC of the front electrode may be comprise a multilayer coating including at least one conductive substantially metallic IR reflecting layer (e.g., based on silver, gold, or the like), and optionally at least one transparent conductive oxide (TCO) layer (e.g., of or including a material such as tin oxide, zinc oxide, or the like). In certain example instances, the multilayer front electrode coating may include a plurality of TCO layers and/or a plurality of conductive substantially metallic IR reflecting layers arranged in an alternating manner in order to provide for reduced visible light reflections, increased conductivity, increased IR reflection capability, and so forth.

In certain example embodiments of this invention, a multilayer front electrode coating may be designed to realize one or more of the following advantageous features: (a) reduced sheet resistance ($R_s$) and thus increased conductivity and improved overall photovoltaic module output power; (b) increased reflection of infrared (IR) radiation thereby reducing the operating temperature of the photovoltaic module so as to increase module output power; (c) reduced reflection and increased transmission of light in the region(s) of from about 400-700 nm, 450-700 nm, or 450-600 nm which leads to increased photovoltaic module output power; (d) reduced total thickness of the front electrode coating which can reduce fabrication costs and/or time; (e) an improved or enlarged process window in forming the TCO layer(s) because of the reduced impact of the TCO's conductivity on the overall electric properties of the module given the presence of the highly conductive substantially metallic layer(s); and/or (f) reduced risk of thermal stress caused module breakage by reflecting solar thermal energy and reducing temperature difference across the module.

In certain example embodiments of this invention, there is provided a photovoltaic device comprising: a front glass substrate; an active semiconductor film; an electrically conductive and substantially transparent front electrode located between at least the front glass substrate and the semiconductor film; wherein the substantially transparent front electrode comprises, moving away from the front glass substrate toward the semiconductor film, at least a first substantially transparent conductive substantially metallic infrared (IR) reflecting layer comprising silver and/or gold, and a first transparent conductive oxide (TCO) film located between at least the IR reflecting layer and the semiconductor film; and wherein the front electrode is provided on an interior surface of the front glass substrate facing the semiconductor film, and an exterior surface of the front glass substrate facing incident light is textured so as to reduce reflection loss of incident solar flux and increase absorption of photons in the semiconductor film, especially when the sunlight coming at a tinted angle.

In certain example embodiments of this invention, there is provided a photovoltaic device comprising: a front glass substrate; a semiconductor film; a substantially transparent front, electrode located between at least the front glass substrate and the semiconductor film; wherein the substantially transparent front electrode comprises, moving away from the front glass substrate toward the semiconductor film, at least a first substantially transparent layer that may or may not be conductive, a substantially metallic infrared (IR) reflecting layer comprising silver and/or gold, and a first transparent conductive oxide (TCO) film located between at least the IR reflecting layer and the semiconductor film.

DETAILED DESCRIPTION OF EXAMPLE EMBODIMENTS OF THE INVENTION

Figure 1:
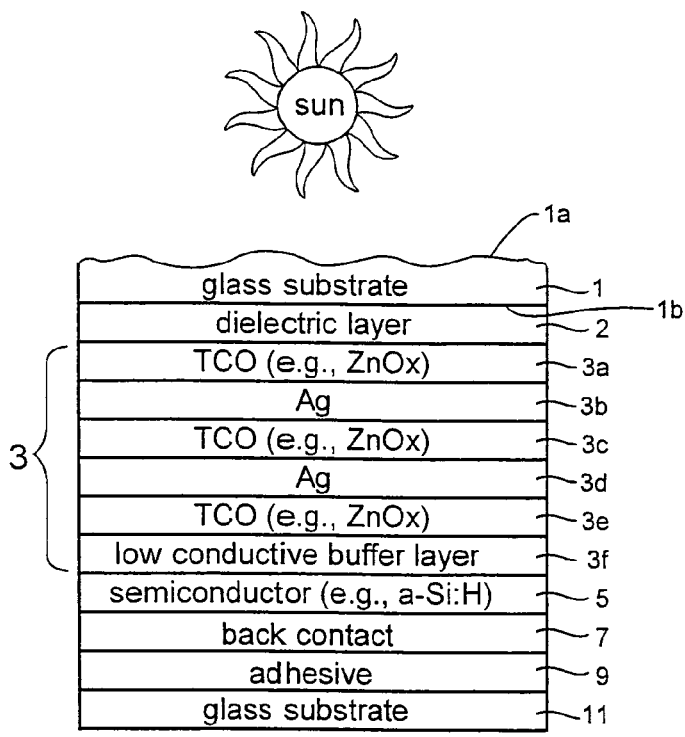
FIG. 1 is a cross sectional view of an example photovoltaic device according to an example embodiment of this invention.

Referring now more particularly to the figures in which like reference numerals refer to like parts/layers in the several views.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si layers, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region as light continues to generate electron-hole pairs in the photovoltaic device.

In certain example embodiments, single junction amorphous silicon (a-Si) photovoltaic devices include three semiconductor layers. In particular, a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. It is noted that while certain example embodiments of this invention are directed toward amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe (including CdS/CdTe) photovoltaic devices, polysilicon and/or microcrystalline Si photovoltaic devices, and the like.

In certain embodiments of this invention, the front electrode of the PV device is of or includes a transparent conductive coating (TCC) having a plurality of layers, and is provided on a surface of a front glass substrate opposite to a patterned surface of the substrate. In certain example embodiments, the patterned (e.g., etched) surface of the front transparent glass substrate faces incoming light, whereas the TCC is provided on the opposite surface of the substrate facing the semiconductor film of the photovoltaic (PV) device. The patterned first or front surface of the glass substrate reduces reflection loss of incident solar flux and increases the absorption of photon(s) in the semiconductor film through scattering, refraction and diffusion, especially when the sunlight coming at a tinted angle. The TCC may act to enhance transmission in selected PV active regions of the visible and near IR spectrum, while substantially rejecting and/or blocking undesired IR thermal energy from certain other areas of the spectrum. In certain example embodiments of this invention, the surface of the front transparent glass substrate on which the front electrode or TCC is provided may be flat or substantially flat (not patterned), whereas in alternative example embodiments it may also be patterned.

FIG. 1 is a cross sectional view of a photovoltaic device according to an example embodiment of this invention. The photovoltaic device includes transparent front glass substrate 1 (other suitable material may also be used for the substrate instead of glass in certain instances), optional dielectric layer(s) 2, multilayer front electrode 3, active semiconductor film 5 of or including one or more semiconductor layers (such as pin, pn, pinpin tandem layer stacks, or the like), back electrode/contact 7 which may be of a TCO or a metal, an optional encapsulant 9 or adhesive of a material such as ethyl vinyl acetate (EVA) or the like, and an optional superstrate 11 of a material such as glass. Of course, other layer(s) which are not shown may also be provided in the device. Front glass substrate 1 and/or rear superstrate (substrate) 11 may be made of soda-lime-silica based glass in certain example embodiments of this invention; and it may have low iron content and/or an antireflection coating thereon to optimize transmission in certain example instances. While substrates 1, 11 may be of glass in certain example embodiments of this invention, other materials such as quartz, plastics or the like may instead be used for substrate(s) 1 and/or 11. Moreover, superstrate 11 is optional in certain instances. Glass 1 and/or 11 may or may not be thermally tempered and/or patterned in certain example embodiments of this invention. Additionally, it will be appreciated that the word "on" as used herein covers both a layer being directly on and indirectly on something, with other layers possibly being located therebetween.

Dielectric layer(s) 2 may be of any substantially transparent material such as a metal oxide and/or nitride which has a refractive index of from about 1.5 to 2.5, more preferably from about 1.6 to 2.5, more preferably from about 1.6 to 2.2, more preferably from about 1.6 to 2.0, and most preferably from about 1.6 to 1.8. However, in certain situations, the dielectric layer 2 may have a refractive index (n) of from about 2.3 to 2.5. Example materials for dielectric layer 2 include silicon oxide, silicon nitride, silicon oxynitride, zinc oxide, tin oxide, titanium oxide (e.g., $TiO_2$), aluminum oxynitride, aluminum oxide, or mixtures thereof. Dielectric layer(s) 2 functions as a barrier layer in certain example embodiments of this invention, to reduce materials such as sodium from migrating outwardly from the glass substrate 1 and reaching the IR reflecting layer(s) and/or semiconductor. Moreover, dielectric layer 2 is material having a refractive index (n) in the range discussed above, in order to reduce visible light reflection and thus increase transmission of visible light (e.g., light from about 400-700 nm, 450-700 nm and/or 450-600 nm) through the coating and into the semiconductor 5 which leads to increased photovoltaic module output power.

Still referring to FIG. 1, multilayer front electrode 3 in the example embodiment shown in FIG. 1, which is provided for purposes of example only and is not intended to be limiting, includes from the glass substrate 1 outwardly first transparent conductive oxide (TCO) or dielectric layer 3a, first conductive substantially metallic IR reflecting layer 3b, second TCO 3c, second conductive substantially metallic IR reflecting layer 3d, third TCO 3e, and optional buffer layer 3f. Optionally, layer 3a may be a dielectric layer instead of a TCO in certain example instances and serve as a seed layer for the layer 3b. This multilayer film 3 makes up the front electrode in certain example embodiments of this invention. Of course, it is possible for certain layers of electrode 3 to be removed in certain alternative embodiments of this invention (e.g., one or more of layers 3a, 3c, 3d and/or 3e may be removed), and it is also possible for additional layers to be provided in the multilayer electrode 3. Front electrode 3 may be continuous across all or a substantial portion of glass substrate 1, or alternatively may be patterned into a desired design (e.g., stripes), in different example embodiments of this invention. Each of layers/films 1-3 is substantially transparent in certain example embodiments of this invention.

First and second conductive substantially metallic IR reflecting layers 3b and 3d may be of or based on any suitable IR reflecting material such as silver, gold, or the like. These materials reflect significant amounts of IR radiation, thereby reducing the amount of IR which reaches the semiconductor film 5. Since IR increases the temperature of the device, the reduction of the amount of IR radiation reaching the semiconductor film 5 is advantageous in that it reduces the operating temperature of the photovoltaic module so as to increase module output power. Moreover, the highly conductive nature of these substantially metallic layers 3b and/or 3d permits the conductivity of the overall electrode 3 to be increased. In certain example embodiments of this invention, the multilayer electrode 3 has a sheet resistance of less than or equal to about 12 ohms/square, more preferably less than or equal to about 9 ohms/square, and even more preferably less than or equal to about 6 ohms/square. Again, the increased conductivity (same as reduced sheet resistance) increases the overall photovoltaic module output power, by reducing resistive losses in the lateral direction in which current flows to be collected at the edge of cell segments. It is noted that first and second conductive substantially metallic IR reflecting layers 3b and 3d (as well as the other layers of the electrode 3) are thin enough so as to be substantially transparent to visible light. In certain example embodiments of this invention, first and/or second conductive substantially metallic IR reflecting layers 3b and/or 3d are each from about 3 to 12 nm thick, more preferably from about 5 to 10 nm thick, and most preferably from about 5 to 8 nm thick. In embodiments where one of the layers 3b or 3d is not used, then the remaining conductive substantially metallic IR reflecting layer may be from about 3 to 18 nm thick, more preferably from about 5 to 12 nm thick, and most preferably from about 6 to 11 nm thick in certain example embodiments of this invention. These thicknesses are desirable in that they permit the layers 3b and/or 3d to reflect significant amounts of IR radiation, while at the same time being substantially transparent to visible radiation which is permitted to reach the semiconductor 5 to be transformed by the photovoltaic device into electrical energy. The highly conductive IR reflecting layers 3b and 3d attribute to the overall conductivity of the electrode 3 much more than the TCO layers; this allows for expansion of the process window(s) of the TCO layer(s) which has a limited window area to achieve both high conductivity and transparency.

First, second, and third TCO layers 3a, 3c and 3e, respectively, may be of any suitable TCO material including but not limited to conducive forms of zinc oxide, zinc aluminum oxide, tin oxide, indium-tin-oxide, indium zinc oxide (which may or may not be doped with silver), or the like. These layers are typically substoichiometric so as to render them conductive as is known in the art. For example, these layers are made of material(s) which gives them a resistance of no more than about 10 ohm-cm (more preferably no more than about 1 ohm-cm, and most preferably no more than about 20 mohm-cm). One or more of these layers may be doped with other materials such as fluorine, aluminum, antimony or the like in certain example instances, so long as they remain conductive and substantially transparent to visible light. In certain example embodiments of this invention, TCO layers 3c and/or 3e are thicker than layer 3a (e.g., at least about 5 nm, more preferably at least about 10, and most preferably at least about 20 or 30 nm thicker). In certain example embodiments of this invention, TCO layer 3a is from about 3 to 80 nm thick, more preferably from about 5-30 nm thick, with an example thickness being about 10 nm. Optional layer 3a is provided mainly as a seeding layer for layer 3b and/or for antireflection purposes, and its conductivity is not as important as that of layers 3b-3e (thus, layer 3a may be a dielectric instead of a TCO in certain example embodiments). In certain example embodiments of this invention, TCO layer 3c is from about 20 to 150 nm thick, more preferably from about 40 to 120 nm thick, with an example thickness being about 74-75 nm. In certain example embodiments of this invention, TCO layer 3e is from about 20 to 180 nm thick, more preferably from about 40 to 130 nm thick, with an example thickness being about 94 or 115 nm. In certain example embodiments, part of layer 3e, e.g., from about 1-25 nm or 5-25 nm thick portion, at the interface between layers 3e and 5 may be replaced with a low conductivity high refractive index (n) film 3f such as titanium oxide to enhance transmission of light as well as to reduce back diffusion of generated electrical carriers; in this way performance may be further improved.

In certain example embodiments, outer surface 1a of the front transparent glass substrate 1 is textured (e.g., etched and/or patterned). Herein, the user of the word "patterned" covers etched surfaces, and the use of the word "etched" covers patterned surfaces. The textured surface 1a of the glass substrate 1 may have a prismatic surface, a matte finish surface, or the like in different example embodiments of this invention. The textured surface 1a of the glass substrate 1 may have peaks and valleys defined therein with inclined portions interconnecting the peaks and valleys (e.g., see FIG. 1). The front major surface of the substrate 1 may be etched (e.g., via HF etching using HF etchant or the like) or patterned via roller(s) or the like during glass manufacture in order to form a textured (and/or patterned) surface 1a. In certain example embodiments, the patterned (e.g., etched) surface 1a of the front transparent glass substrate 1 faces incoming light (see the sun in the figures), whereas the TCC 3 is provided on the opposite surface 1b of the substrate facing the semiconductor film 5 of the photovoltaic (PV) device. The patterned first or front surface 1a of the glass substrate 1 reduces reflection loss of incident solar flux and increases the absorption of photon(s) in the semiconductor film 5 through scattering, refraction and/or diffusion. The transmission of solar flux into the photovoltaic semiconductor 5 can be further improved by using the patterned/etched surface 1a of the front glass substrate 1 in combination with the Ag-based TCC 3 as shown in FIGS. 1 and 5-11. The patterned and/or etched surface 1a results in an effective low index layer due to the introduction of the void(s), and acts as an antireflection coating. Compared to a smooth front surface of the front substrate, the patterned and/or etched surface 1a provides the following example advantages: (a) reduced reflection from the first surface 1a, especially at oblique incident angles, due to light trapping and hence increased solar flux into solar cells, and (b) increased optical path of light in the semiconductor 5 thereby resulting in increased photovoltaic current. This may be applicable to embodiments of FIGS. 1 and 5-11 in certain instances.

In certain example embodiments of this invention, average surface roughness on surface 1a of the front glass substrate is from about 0.1 μm to 1 mm, more preferably from about 0.5-20 μm, more preferably from about 1-10 μm, and most preferably from about 2-8 μm. Too large of a surface roughness value could lead to much dirt collection on the front of the substrate 1, whereas too little of a roughness value on surface 1a could lead to not enough transmission increase. This surface roughness at 1a may be appliable to any embodiment discussed herein. The provision of such surface roughness on the surface 1a of the substrate is also advantageous in that it can avoid the need for a separate AR coating on the front glass substrate 1 in certain example embodiments of this invention.

In certain example embodiments, the interior or second surface 1b of the front glass substrate 1 is flat or substantially flat. In other words, surface 1b is not patterned or etched. In such embodiments, as shown in the figures, the front electrode 3 is provided on the flat or substantially flat-surface 1b of the glass substrate 1. Accordingly, the layers 3a-3f of the electrode 3 are all substantially flat or planar in such example embodiments of this invention. Alternatively, in other example embodiments, the inner surface 1b of the glass substrate 1 may be patterned like outer surface 1a.

In certain example embodiments of this invention, the photovoltaic device may be made by providing glass substrate 1, and then depositing (e.g., via sputtering or any other suitable technique) multilayer electrode 3 on the substrate 1. Thereafter the structure including substrate 1 and front electrode 3 is coupled with the rest of the device in order to form the photovoltaic device shown in FIG. 1. For example, the semiconductor layer 5 may then be formed over the front electrode on substrate 1. Alternatively, the back contact 7 and semiconductor 5 may be fabricated/formed on substrate 11 (e.g., of glass or other suitable material) first; then the electrode 3 and dielectric 2 may be formed on semiconductor 5 and encapsulated by the substrate 1 via an adhesive such as EVA.

The alternating nature of the TCO layers 3a, 3c and/or 3e, and the conductive substantially metallic IR reflecting layers 3b and/or 3d, is also advantageous in that it also one, two, three, four or all of the following advantages to be realized: (a) reduced sheet resistance ($R_s$) of the overall electrode 3 and thus increased conductivity and improved overall photovoltaic module output power; (b) increased reflection of infrared (IR) radiation by the electrode 3 thereby reducing the operating temperature of the semiconductor 5 portion of the photovoltaic module so as to increase module output power; (c) reduced reflection and increased transmission of light in the visible region of from about 450-700 nm (and/or 450-600 mm) by the front electrode 3 which leads to increased photovoltaic module output power; (d) reduced total thickness of the front electrode coating 3 which can reduce fabrication costs and/or time; (e) an improved or enlarged process window in forming the TCO layer(s) because of the reduced impact of the TCO's conductivity on the overall electric properties of the module given the presence of the highly conductive substantially metallic layer(s); and/or (f) reduced risk of thermal stress caused module breakage by reflecting solar thermal energy and reducing temperature difference across the module.

The active semiconductor region or film 5 may include one or more layers, and may be of any suitable material. For example, the active semiconductor film 5 of one type of single junction amorphous silicon (a-Si) photovoltaic device includes three semiconductor layers, namely a p-layer, an n-layer and an i-layer. The p-type a-Si layer of the semiconductor film 5 may be the uppermost portion of the semiconductor film 5 in certain example embodiments of this invention; and the i-layer is typically located between the p and n-type layers. These amorphous silicon based layers of film 5 may be of hydrogenated amorphous silicon in certain instances, but may also be of or include hydrogenated amorphous silicon carbon or hydrogenated amorphous silicon germanium, hydrogenated microcrystalline silicon, or other suitable material(s) in certain example embodiments of this invention. It is possible for the active region 5 to be of a double-junction or triple-junction type in alternative embodiments of this invention. CdTe may also be used for semiconductor film 5 in alternative embodiments of this invention.

Back contact, reflector and/or electrode 7 may be of any suitable electrically conductive material. For example and without limitation, the back contact or electrode 7 may be of a TCO and/or a metal in certain instances. Example TCO materials for use as back contact or electrode 7 include indium zinc oxide, indium-tin-oxide (ITO), tin oxide, and/or zinc oxide which may be doped with aluminum (which may or may not be doped with silver). The TCO of the back contact 7 may be of the single layer type or a multi-layer type in different instances. Moreover, the back contact 7 may include both a TCO portion and a metal portion in certain instances. For example, in an example multi-layer embodiment, the TCO portion of the back contact 7 may include a layer of a material such as indium zinc oxide (which may or may not be doped with silver), indium-tin-oxide (ITO), tin oxide, and/or zinc oxide closest to the active region 5, and the back contact may include another conductive and possibly reflective layer of a material such as silver, molybdenum, platinum, steel, iron, niobium, titanium, chromium, bismuth, antimony, or aluminum further from the active region 5 and closer to the superstrate 11. The metal portion may be closer to superstrate 11 compared to the TCO portion of the back contact 7.

The photovoltaic module may be encapsulated or partially covered with an encapsulating material such as encapsulant 9 in certain example embodiments. An example encapsulant or adhesive for layer 9 is EVA or PVB. However, other materials such as Tedlar type plastic, Nuvasil type plastic, Tefzel type plastic or the like may instead be used for layer 9 in different instances.

Figure 2:
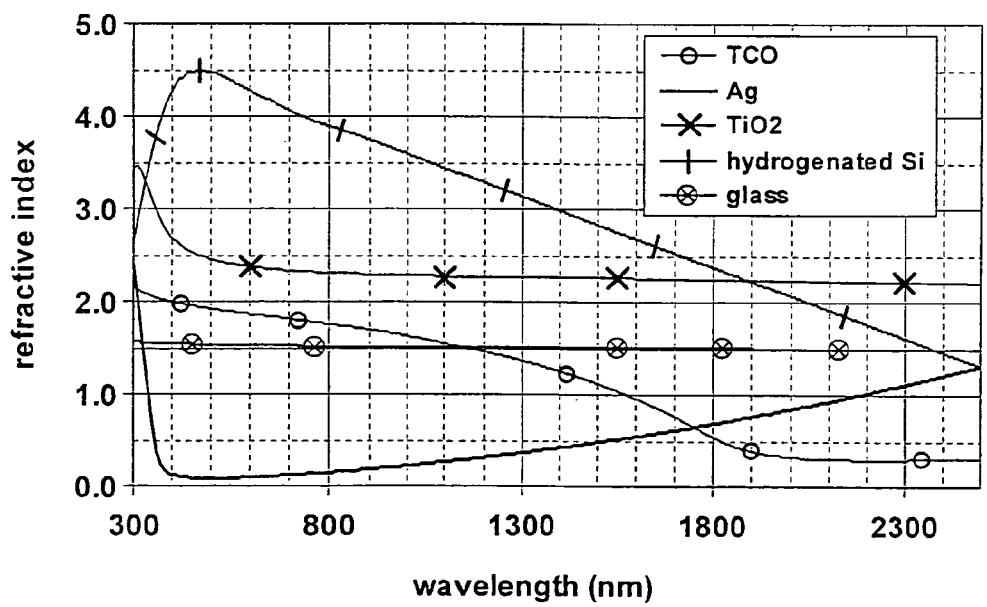
FIG. 2 is a refractive index (n) versus wavelength (nm) graph illustrating refractive indices (n) of glass, a TCO film, silver thin film, and hydrogenated silicon (in amorphous, micro- or poly-crystalline phase).
Figure 3:
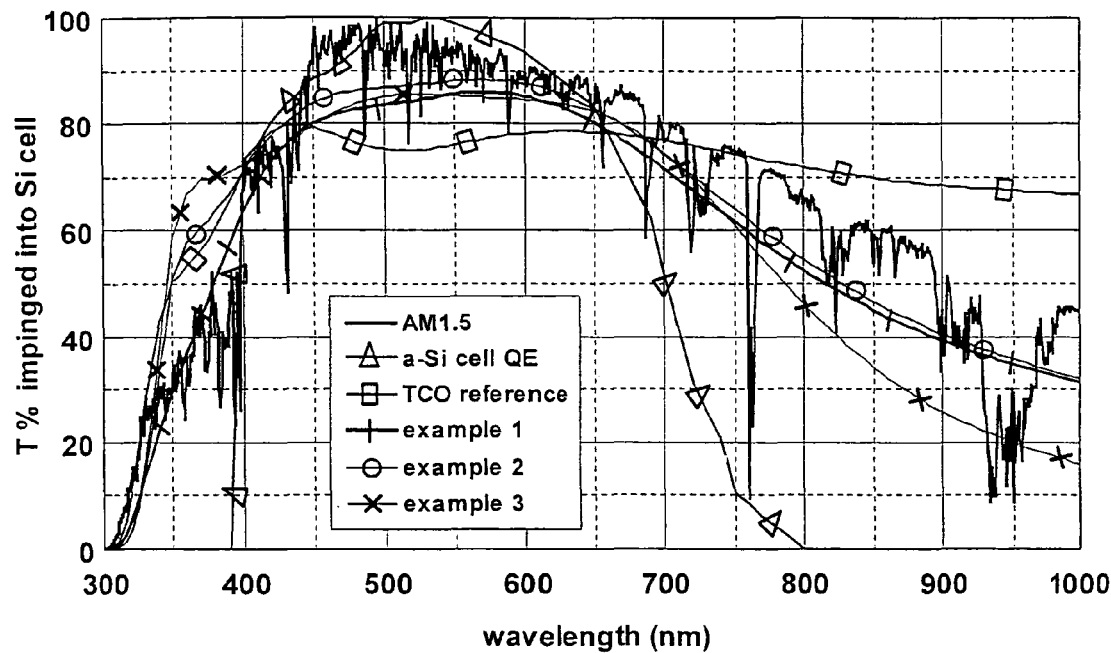
FIG. 3 is a percent transmission (T %) versus wavelength (nm) graph illustrating transmission spectra into a hydrogenated Si thin film of a photovoltaic device comparing examples of this invention versus a comparative example (TCO reference); this shows that the examples of this invention (Examples 1, 2 and 3) have increased transmission in the approximately 450-700 nm wavelength range and thus increased photovoltaic module output power, compared to the comparative example (TCO reference).

Utilizing the highly conductive substantially metallic IR reflecting layers 3b and 3d, and TCO layers 3a, 3c and 3d, to form a multilayer front electrode 3, permits the thin film photovoltaic device performance to be improved by reduced sheet resistance (increased conductivity) and tailored reflection and transmission spectra which best fit photovoltaic device response. Refractive indices of glass 1, hydrogenated a-Si as an example semiconductor 5, Ag as an example for layers 3b and 3d, and an example TCO are shown in FIG. 2. Based on these refractive indices (n), predicted transmission spectra impinging into the semiconductor 5 from the incident surface of substrate 1 are shown in FIG. 3. In particular, FIG. 3 is a percent transmission (T %) versus wavelength (nm) graph illustrating transmission spectra into a hydrogenated Si thin film 5 of a photovoltaic device comparing Examples 1-3 of this invention (see Examples 1-3 in FIGS. 5-7) versus a comparative example (TCO reference). The TCO reference was made up of 3 mm thick glass substrate 1 and from the glass outwardly 30 nm of tin oxide, 20 nm of silicon oxide and 350 nm of TCO. FIG. 3 thus shows that the examples of this invention (Examples 1-3 shown in FIGS. 5-7) has increased transmission in the approximately 450-600 and 450-700 nm wavelength ranges and thus increased photovoltaic module output power, compared to the comparative example (TCO reference).

Figure 4:
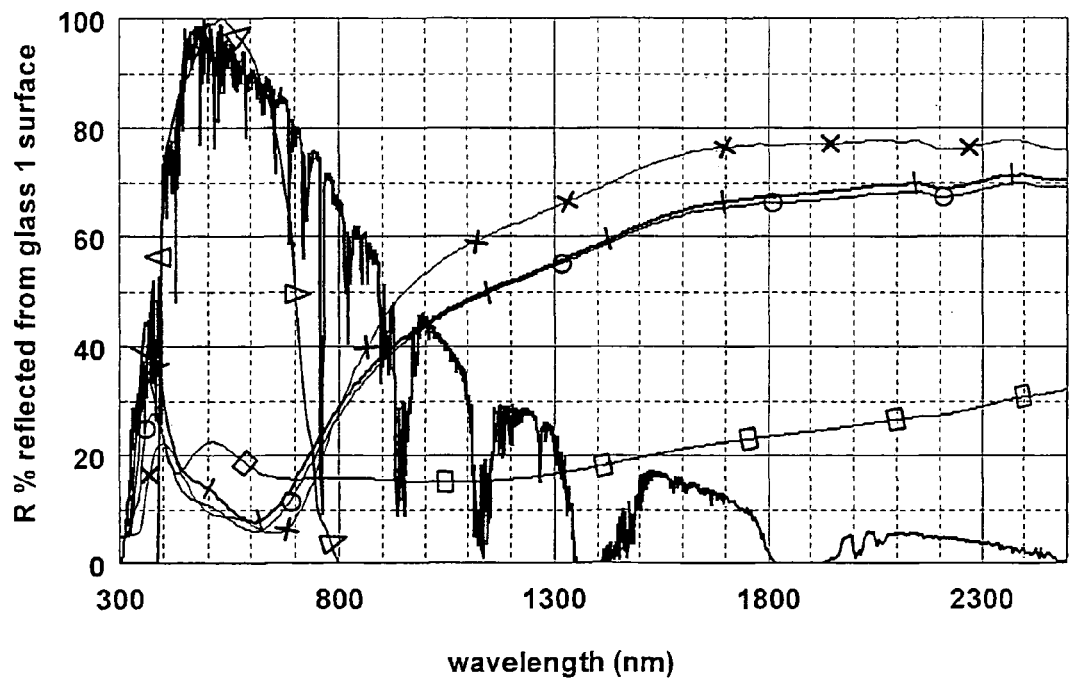
FIG. 4 is a percent reflection (R %) versus wavelength (nm) graph illustrating reflection spectra from a hydrogenated Si thin film of a photovoltaic device comparing the examples of this invention (Examples 1, 2 and 3 referred to in FIG. 3) versus a comparative example (TCO reference referred to in FIG. 3); this shows that the example embodiment of this invention have increased reflection in the IR range, thereby reducing the operating temperature of the photovoltaic module so as to increase module output power, compared to the comparative example. Because the same Examples 1-3 and comparative example (TCO reference) are being referred to in FIGS. 3 and 4, the same curve identifiers used in FIG. 3 are also used in FIG. 4.
Figure 5:
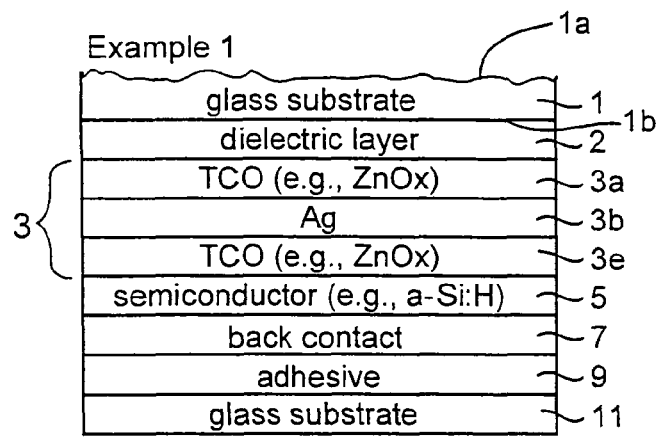
FIG. 5 is a cross sectional view of the photovoltaic device according to Example 1 of this invention.
Figure 6:
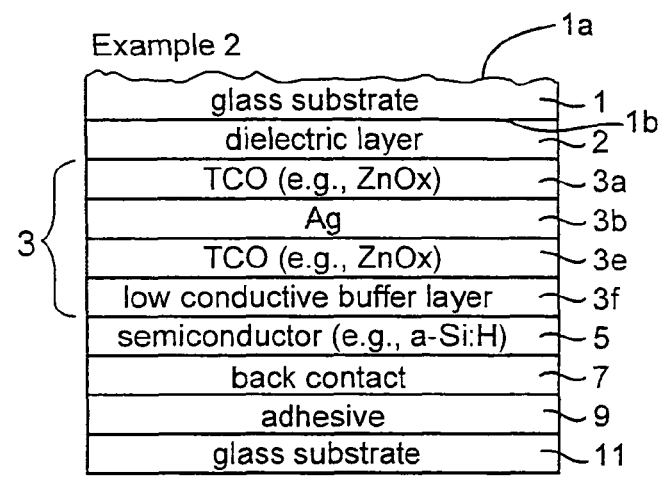
FIG. 6 is a cross sectional view of the photovoltaic device according to Example 2 of this invention.
Figure 7:
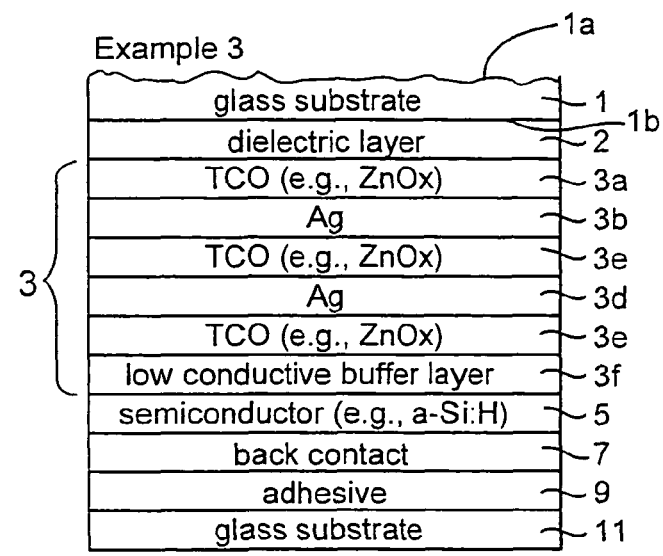
FIG. 7 is a cross sectional view of the photovoltaic device according to Example 3 of this invention.

Example 1 shown in FIG. 5 and charted in FIGS. 3-4 was made up of 3 mm thick glass substrate 1, 16 nm thick $TiO_2$ dielectric layer 2, 10 nm thick zinc oxide TCO doped with Al 3a, 8 nm thick Ag IR reflecting layer 3b, and 115 nm thick zinc oxide TCO doped with Al 3e. Surface 1a was flat in this example. Layers 3c, 3d and 3f were not present in Example 1. Example 2 shown in FIG. 6 and charted in FIGS. 3-4 was made up of 3 mm thick glass substrate 1 with a flat surface 1a, 16 nm thick $TiO_2$ dielectric layer 2, 10 nm thick zinc oxide TCO doped with Al 3a, 8 nm thick Ag IR reflecting layer 3b, 100 nm thick zinc oxide TCO doped with Al 3e, and 20 nm thick titanium suboxide layer 3f. Example 3 shown in FIG. 7 and charted in FIGS. 3-4 was made up of 3 mm thick glass substrate 1 with a flat surface 1a, 45 nm thick dielectric layer 2, 10 nm thick zinc oxide TCO doped with Al 3a, 5 nm thick Ag IR reflecting layer 3b, 75 nm thick zinc oxide TCO doped with Al 3c, 7 nm thick Ag IR reflecting layer 3d, 95 nm thick zinc oxide TCO doped with Al 3e, and 20 nm thick titanium suboxide layer 3f. These single and double-silver layered coatings of Examples 1-3 had a sheet resistance less than 10 ohms/square and 6 ohms/square, respectively, and total thicknesses much less than the 400 nm thickness of the prior art. Examples 1-3 had tailored transmission spectra, as shown in FIG. 3, having more than 80% transmission into the semiconductor 5 in part or all of the wavelength range of from about 450-600 nm and/or 450-700 nm, where AM1.5 has the strongest intensity and photovoltaic devices may possibly have the highest or substantially the highest quantum efficiency.

Meanwhile, FIG. 4 is a percent reflection (R %) versus wavelength (nm) graph illustrating reflection spectra from a hydrogenated Si thin film of a photovoltaic device comparing Examples 1-3 versus the above mentioned comparative example; this shows that Examples 1-3 had increased reflection in the IR range thereby reducing the operating temperature of the photovoltaic modules so as to increase module output power, compared to the comparative example. In FIG. 4, the low reflection in the visible range of from about 450-600 nm and/or 450-700 nm (the cell's high efficiency range) is advantageously coupled with high reflection in the near and short IR range beyond about 1000 nm; the high reflection in the near and short IR range reduces the absorption of solar thermal energy that will result in a better cell output due to the reduced cell temperature and series resistance in the module. As shown in FIG. 4, the front glass substrate 1 and front electrode 3 taken together have a reflectance of at least about 45% (more preferably at least about 55%) in a substantial part or majority of a near to short IR wavelength range of from about 1000-2500 nm and/or 1000 to 2300 nm. In certain example embodiments, it reflects at least 50% of solar energy in the range of from 1000-2500 nm and/or 1200-2300 nm. In certain example embodiments, the front glass substrate and front electrode 3 taken together have an IR reflectance of at least about 45% and/or 55% in a substantial part or a majority of a near IR wavelength range of from about 1000-2500 nm, possibly from 1200-2300 nm. In certain example embodiments, it may block at least 50% of solar energy in the range of 1000-2500 nm.

While the electrode 3 is used as a front electrode in a photovoltaic device in certain embodiments of this invention described and illustrated herein, it is also possible to use the electrode 3 as another electrode in the context of a photovoltaic device or otherwise.

Figure 8:
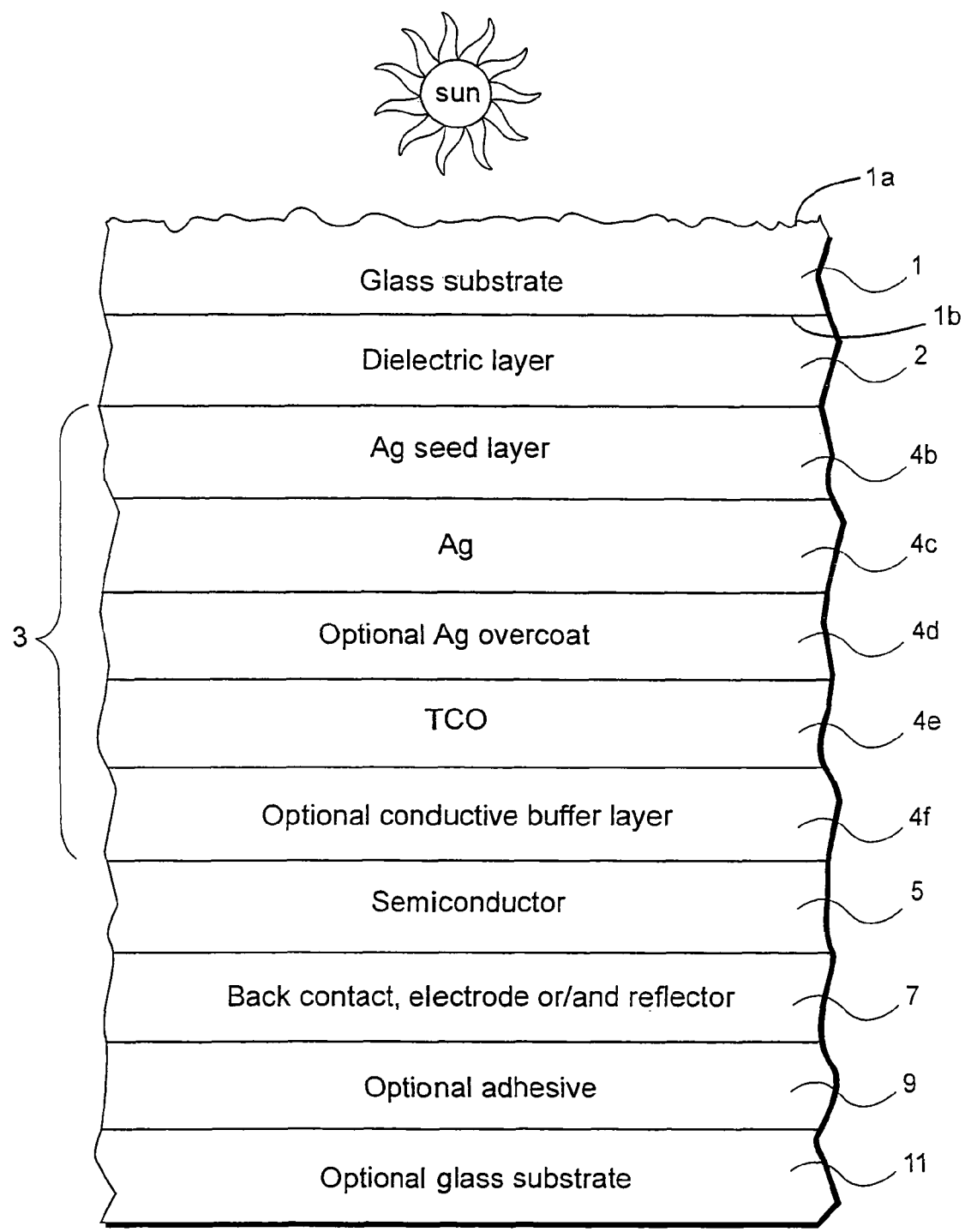
FIG. 8 is a cross sectional view of the photovoltaic device according to another example embodiment of this invention.

FIG. 8 is a cross sectional view of a photovoltaic device according to another example embodiment of this invention. An optional antireflective (AR) layer (not shown) may be provided on the light incident side of the front glass substrate 1 in any embodiment of this invention. The photovoltaic device in FIG. 8 includes glass substrate 1, dielectric layer(s) 2 (e.g., of or including one or more of silicon oxide, silicon oxynitride, silicon nitride, titanium oxide, niobium oxide, and/or the like) which may function as a sodium barrier for blocking sodium from migrating out of the front glass substrate 1, seed layer 4b (e.g., of or including zinc oxide, zinc aluminum oxide, tin oxide, tin antimony oxide, indium zinc oxide, or the like) which may be a TCO or dielectric in different example embodiments, silver based IR reflecting layer 4c, optional overcoat or contact layer 4d (e.g., of or including an oxide of Ni and/or Cr, zinc oxide, zinc aluminum oxide, or the like) which may be a TCO, TCO 4e (e.g., of or including zinc oxide, zinc aluminum oxide, tin oxide, tin antimony oxide, zinc tin oxide, indium tin oxide, indium zinc oxide, or the like), optional buffer layer 4f (e.g., of or including zinc oxide, zinc aluminum oxide, tin oxide, tin antimony oxide, zinc tin oxide, indium tin oxide, indium zinc oxide, or the like) which may be conductive to some extent, semiconductor 5 (e.g., CdS/CdTe, a-Si, or the like), optional back contact, reflector and/or electrode 7, optional adhesive 9, and optional back glass substrate 11. It is noted that in certain example embodiments, layer 4b may be the same as layer 3a described above, layer 4c may be the same as layer 3b or 3d described above this applies to FIGS. 8-10), layer 4e may be the same as layer 3e described above (this also applies to FIGS. 8-10), and layer 4f may be the same as layer 3f described above (this also applies to FIGS. 8-10) (see descriptions above as to other embodiments in this respect). Likewise, layers 1, 5, 7, 9 and 11 are also discussed above in connection with other embodiments, as are surfaces 1a and 1b of the front glass substrate 1.

For purposes of example only, an example of the FIG. 8 embodiment is as follows (note that certain optional layers shown in FIG. 8 are not used in this example). For example, referring to FIG. 8, glass substrate 1 (e.g., about 3.2 mm thick), dielectric layer 2 (e.g., silicon oxynitride about 20 nm thick possibly followed by dielectric TiOx about 20 nm thick), Ag seed layer 4b (e.g., dielectric or TCO zinc oxide or zinc aluminum oxide about 10 nm thick), IR reflecting layer 4c (silver about 5-8 nm thick), TCO 4e (e.g., conductive zinc oxide, tin oxide, zinc aluminum oxide, ITO from about 50-250 nm thick, more preferably from about 100-150 nm thick), and possibly conductive buffer layer 4f (TCO zinc oxide, tin oxide, zinc aluminum oxide, ITO, or the like, from about 10-50 nm thick). In certain example embodiments, the buffer layer 4f (or 3f) is designed to have a refractive index (n) of from about 2.1 to 2.4, more preferably from about 2.15 to 2.35, for substantial index matching to the semiconductor 5 (e.g., CdS or the like) in order to improve efficiency of the device.

The photovoltaic device of FIG. 8 may have a sheet resistance of no greater than about 18 ohms/square, more preferably no greater than about 15 ohms/square, even more preferably no greater than about 13 ohms/square in certain example embodiments of this invention. Moreover, the FIG. 8 embodiment may have tailored transmission spectra having more than 80% transmission into the semiconductor 5 in part or all of the wavelength range of from about 450-600 nm and/or 450-700 nm, where AM1.5 may have the strongest intensity and in certain example instances the cell may have the highest or substantially the highest quantum efficiency.

Figure 9:
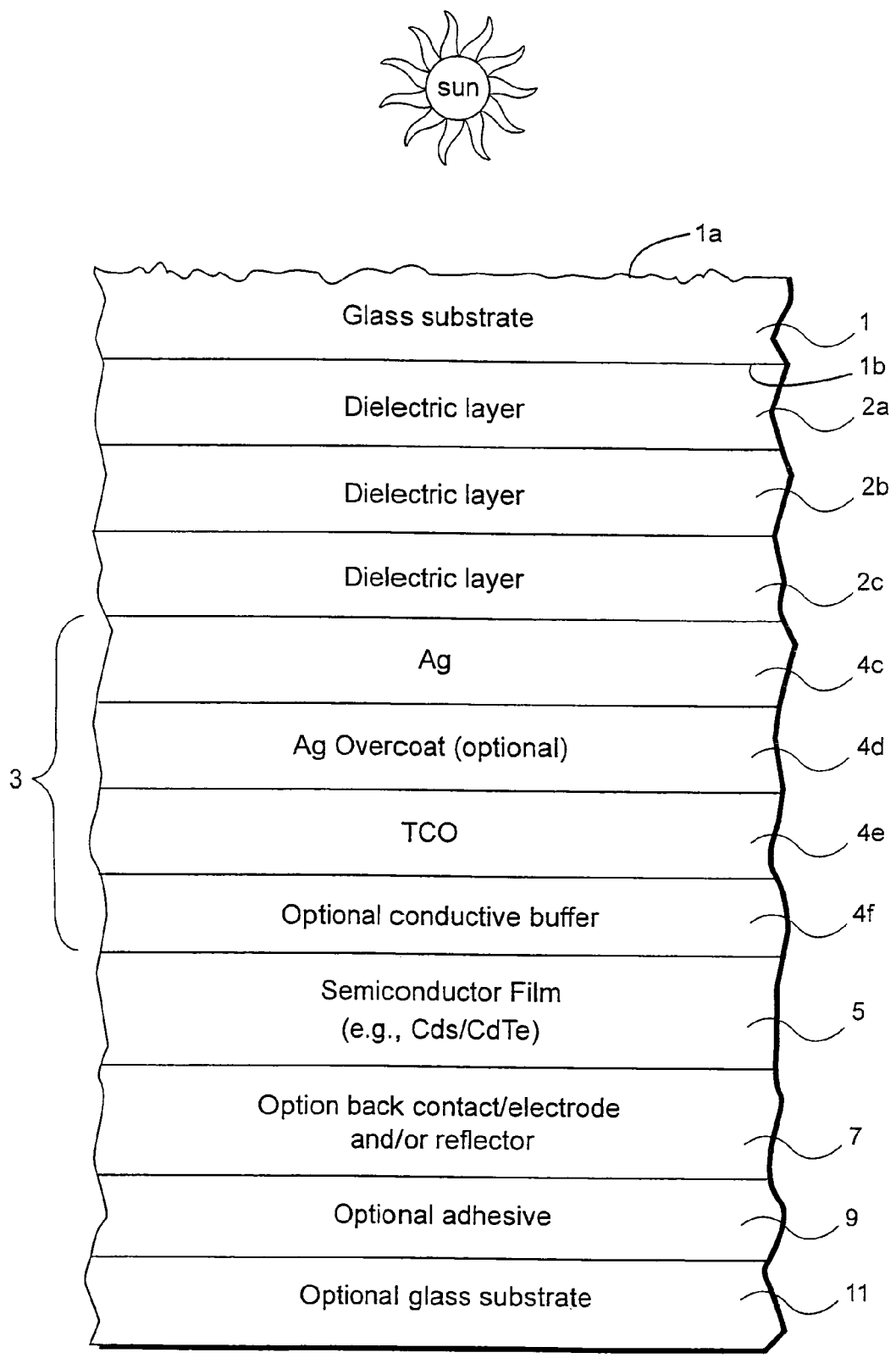
FIG. 9 is a cross sectional view of the photovoltaic device according to another example embodiment of this invention.

FIG. 9 is a cross sectional view of a photovoltaic device according to yet another example embodiment of this invention. The photovoltaic device of the FIG. 9 embodiment includes optional antireflective (AR) layer (not shown) on the light incident side of the front glass substrate 1, first dielectric layer 2a, second dielectric layer 2b, third dielectric layer 2c which may optionally function as a seed layer (e.g., of or including zinc oxide, zinc aluminum oxide, tin oxide, tin antimony oxide, indium zinc oxide, or the like) for the silver based layer 4c, conductive silver based IR reflecting layer 4c, optional overcoat or contact layer 4d (e.g., of or including an oxide of Ni and/or Cr, zinc oxide, zinc aluminum oxide, or the like) which may be a TCO or dielectric, TCO 4e (e.g., including one or more layers, such as of or including zinc oxide, zinc aluminum oxide, tin oxide, tin antimony oxide, zinc tin oxide, indium tin oxide, indium zinc oxide, or the like), optional conductive buffer layer 4f (e.g., of or including zinc oxide, zinc aluminum oxide, tin oxide, tin antimony oxide, zinc tin oxide, indium tin oxide, indium zinc oxide, or the like), semiconductor 5 (e.g., one or more layers such as CdS/CdTe, a-Si, or the like), optional back contact, reflector and/or electrode 7, optional adhesive 9, and optional back/rear glass substrate 11. Layers 4e and 4f are preferably conductive in order to ensure that the metal layer 4c can be used in connection with the absorber film 5 to generate charge. Semiconductor film 5 may include a single pin or pn semiconductor structure, or a tandem semiconductor structure in different embodiments of this invention. Semiconductor 5 may be of or include silicon in certain example instances. In other example embodiments, semiconductor film 5 may include a first layer of or including CdS (e.g., window layer) adjacent or closest to layer(s) 4e and/or 4f and a second semiconductor layer of or including CdTe (e.g., main absorber) adjacent or closest to the back electrode or contact 7.

Referring to the FIG. 9 embodiment (and the FIG. 10 embodiment), in certain example embodiments, first dielectric layer 2a has a relatively low refractive index (n) (e.g., n of from about 1.7 to 2.2, more preferably from about 1.8 to 2.2, still more preferably from about 1.95 to 2.1, and most preferably from about 2.0 to 2.08), second dielectric layer 2b has a relatively high (compared to layer 2a) refractive index (n) (e.g., n of from about 2.2 to 2.6, more preferably from about 2.3 to 2.5, and most preferably from about 2.35 to 2.45), and third dielectric layer 2c has a relatively low (compared to layer 2b) refractive index (n) (e.g., n of from about 1.8 to 2.2, more preferably from about 1.95 to 2.1, and most preferably from about 2.0 to 2.05). In certain example embodiments, the first low index dielectric layer 2a may be of or include silicon nitride, silicon oxynitride, or any other suitable material, the second high index dielectric layer 2b may be of or include an oxide of titanium (e.g., $TiO_2$ or the like), and the third dielectric layer 2c may be of or include zinc oxide or any other suitable material. In certain example embodiments, layers 2a-2c combine to form a good index matching stack which also functions as a buffer against sodium migration from the glass 1. In certain example embodiments, the first dielectric layer 2a is from about 5-30 nm thick, more preferably from about 10-20 nm thick, the second dielectric layer 2b is from about 5-30 nm thick, more preferably from about 10-20 nm thick, and the third layer 2c is of a lesser thickness and is from about 3-20 nm thick, more preferably from about 5-15 nm thick, and most preferably from about 6-14 nm thick. While layers 2a, 2b and 2c are dielectrics in certain embodiments of this invention, one, two or all three of these layers may be dielectric or TCO in certain other example embodiments of this invention. Layers 2b and 2c are metal oxides in certain example embodiments of this invention, whereas layer 2a is a metal oxide and/or nitride, or silicon nitride in certain example instances. Layers 2a-2c may be deposited by sputtering or any other suitable technique.

Still referring to the FIG. 9 embodiment (and the FIG. 10-11 embodiments), the TCO layer(s) 4e may be of or include any suitable TCO including but not limited to zinc oxide, zinc aluminum oxide, tin oxide and/or the like. TCO layer or file 4e may include multiple layers in certain example instances. For example, certain instances, the TCO 4 includes a first layer of a first TCO metal oxide (e.g., zinc oxide)

adjacent Ag 4c, Ag overcoat 4d and a second layer of a second TCO metal oxide (e.g., tin oxide) adjacent and contacting layer 4f and/or 5.

For purposes of example only, an example of the FIG. 9 embodiment is as follows. For example, referring to FIG. 9, glass substrate 1 (e.g., float glass about 3.2 mm thick, and a refractive index n of about 1.52), first dielectric layer 2a (e.g., silicon nitride about 15 nm thick, having a refractive index n of about 2.07), second dielectric layer 2b (e.g., oxide of Ti, such as $TiO_2$ or other suitable stoichiometry, about 16 nm thick, having a refractive index n of about 2.45), third dielectric layer 2c (e.g., zinc oxide, possibly doped with Al, about 9 nm thick, having a refractive index n of about 2.03), IR reflecting layer 4c (silver about 3-9 nm thick, e.g., 6 nm), silver overcoat 4d of $NiCrO_x$ about 1-3 nm thick which may or may not be oxidation graded, TCO film 4e (e.g., conductive zinc oxide, zinc aluminum oxide and/or tin oxide about 10-150 nm thick), a semiconductor film 5 including a first layer of CdS (e.g., about 70 nm) closest to substrate 1 and a second layer of CdTe further from substrate 1, back contact or electrode 7, optional adhesive 9, and optionally substrate 11.

The photovoltaic device of FIG. 9 (and/or FIGS. 10-11) may have a sheet resistance of no greater than about 18 ohms/square, more preferably no greater than about 15 ohms/square, even more preferably no greater than about 13 ohms/square in certain example embodiments of this invention. Moreover, the FIG. 9 (and/or FIGS. 10-11) embodiment may have tailored transmission spectra having more than 80% transmission into the semiconductor 5 in part or all of the wavelength range of from about 450-600 nm and/or 450-700 nm, where AM1.5 may have the strongest intensity.

Figure 10:
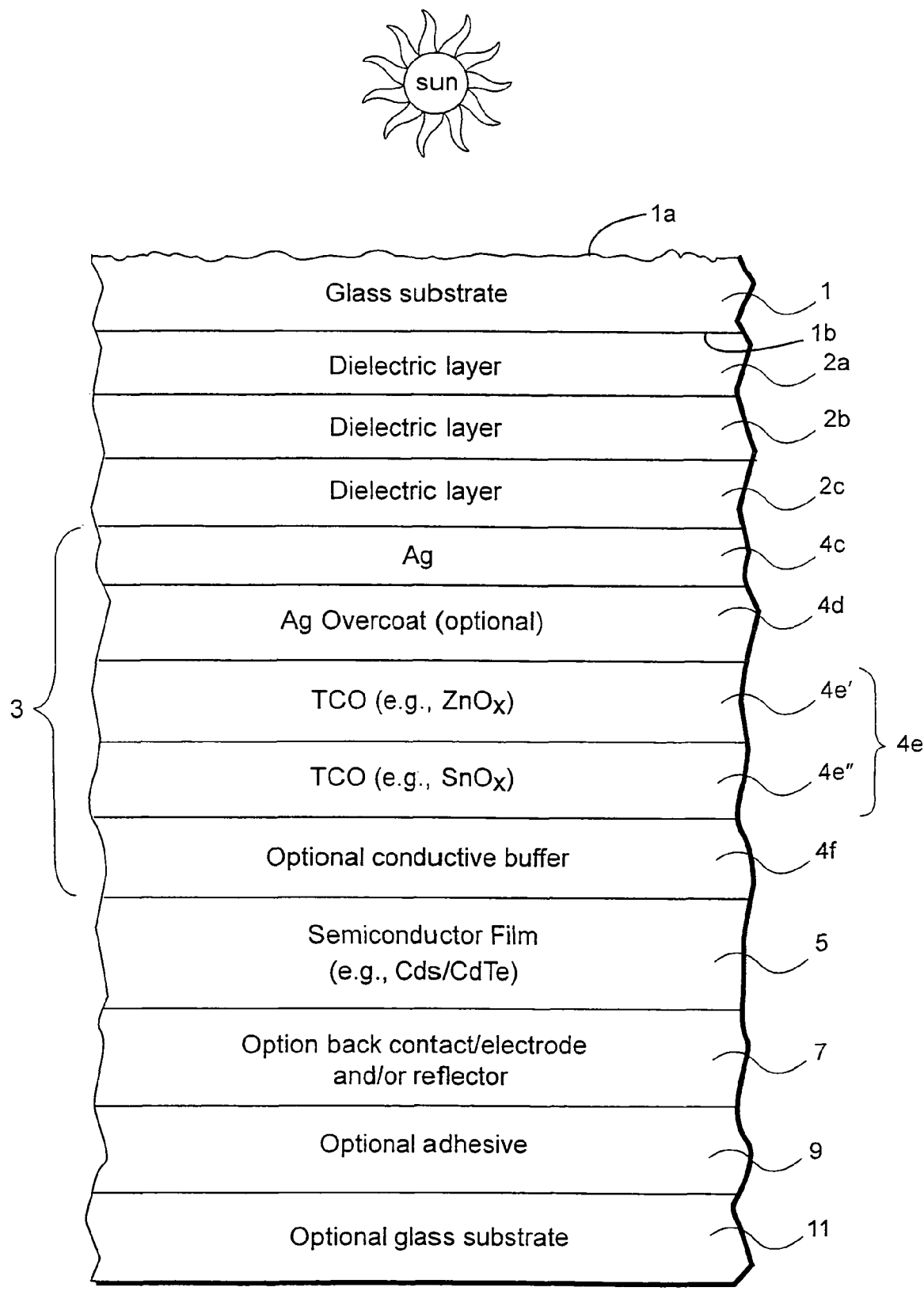
FIG. 10 is a cross sectional view of the photovoltaic device according to another example embodiment of this invention.

FIG. 10 is a cross sectional view of a photovoltaic device according to still another example embodiment of this invention. The FIG. 10 embodiment is the same as the FIG. 9 embodiment discussed above, except for the TCO film 4e. In the FIG. 10 embodiment, the TCO film 4e includes a first layer 4e' of or including a first TCO metal oxide (e.g., zinc oxide, which may or may not be doped with Al or the like) adjacent and contacting layer 4d and a second layer 4e" of a second TCO metal oxide (e.g., tin oxide) adjacent and contacting layer 4f and/or 5 (e.g., layer 4f may be omitted, as in previous embodiments). Layer 4e' is also substantially thicker than layer 4e" in certain example embodiments. In certain example embodiments, the first TCO layer 4e' has a resistivity which is less than that of the second TCO layer 4e". In certain example embodiments, the first TCO layer 4e' may be of zinc oxide, Al-doped zinc oxide, or ITO about 70-150 nm thick (e.g., about 110 nm) having a resistivity of no greater than about 1 ohm·cm, and the second TCO layer 4e" may be of tin oxide about 10-50 nm thick (e.g., about 30 nm) having a resistivity of from about 10-100 ohm·cm, possibly from about 2-100 ohm·cm. The first TCO layer 4e' is thicker and more conductive than the second TCO layer 4e" in certain example embodiments, which is advantageous as layer 4e' is closer to the conductive Ag based layer 4c thereby leading to improved efficiency of the photovoltaic device. Moreover, this design is advantageous in that CdS of the film 5 adheres or sticks well to tin oxide which may be used in or for layer 4e". TCO layers 4e' and/or 4e" may be deposited by sputtering or any other suitable technique.

In certain example instances, the first TCO layer 4e' may be of or include ITO (indium tin oxide) instead of zinc oxide. In certain example instances, the ITO of layer 4e' may be about 90% In, 10% Sn, or alternatively about 50% In, 50% Sn.

The use of at least these three dielectrics 2a-2c is advantageous in that it permits reflections to be reduced thereby resulting in a more efficient photovoltaic device. Moreover, it is possible for the overcoat layer 4d (e.g., of or including an oxide of Ni and/or Cr) to be oxidation graded, continuously or discontinuously, in certain example embodiments of this invention. In particular, layer 4d may be designed so as to be more metallic (less oxided) at a location therein closer to Ag based layer 4d than at a location therein further from the Ag based layer 4d; this has been found to be advantageous for thermal stability reasons in that the coating does not degrade as much during subsequently high temperature processing which may be associated with the photovoltaic device manufacturing process or otherwise.

In certain example embodiments of this invention, it has been surprisingly found that a thickness of from about 120-160 nm, more preferably from about 130-150 nm (e.g., 140 nm), for the TCO film 4e is advantageous in that the Jsc peaks in this range. For thinner TCO thicknesses, the Jsc decreases by as much as about 6.5% until it bottoms out at about a TCO thickness of about 60 nm. Below 60 nm, it increases again until at a TCO film 4e thickness of about 15-35 nm (more preferably 20-30 nm) it is attractive, but such thin coatings may not be desirable in certain example non-limiting situations. Thus, in order to achieve a reduction in short circuit current density of CdS/CdTe photovoltaic devices in certain example instances, the thickness of TCO film 4e may be provided in the range of from about 15-35 nm, or in the range of from about 120-160 nm or 130-150 nm.

Figure 11:
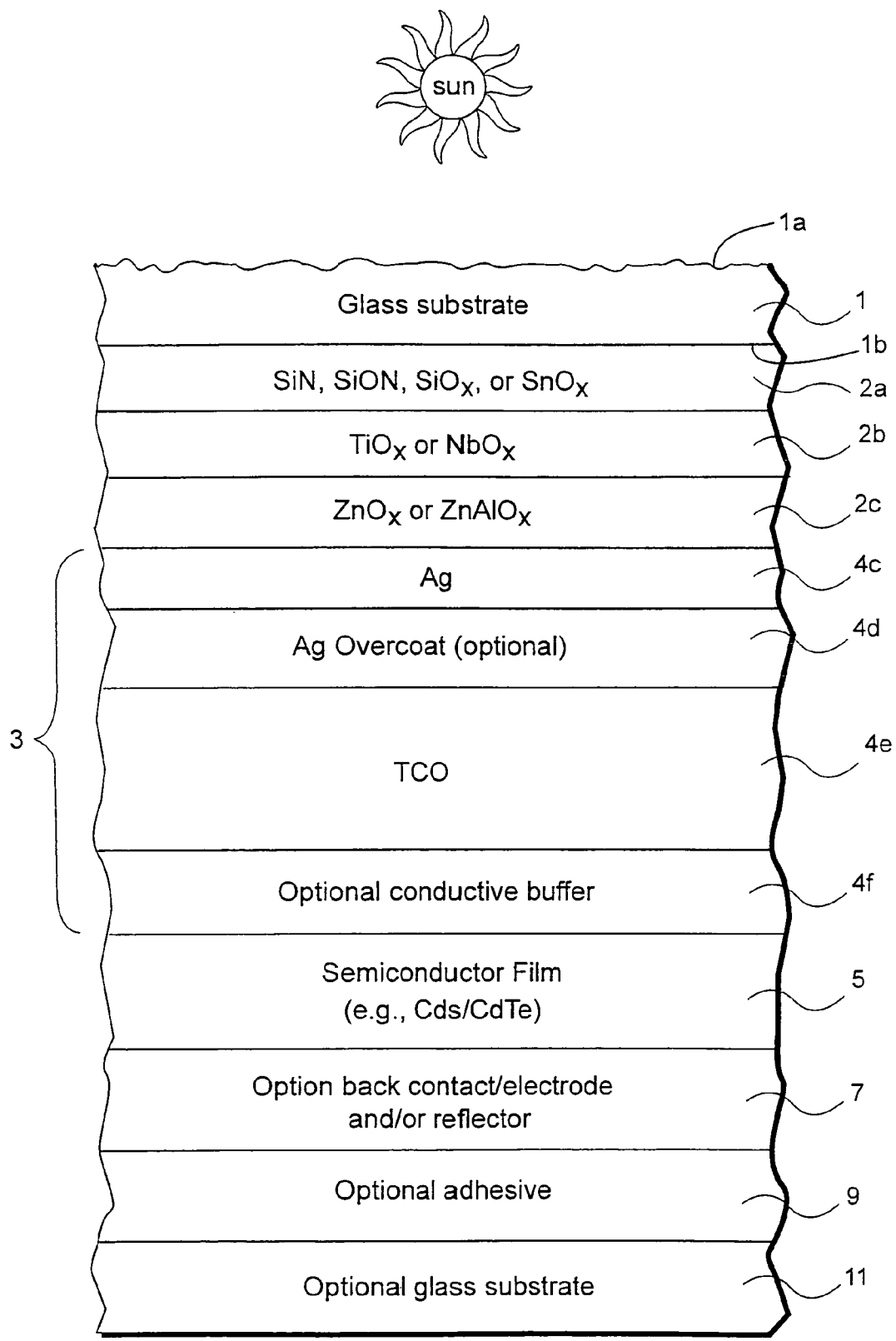
FIG. 11 is a cross sectional view of the photovoltaic device according to another example embodiment of this invention.

FIG. 11 is a cross sectional view of a photovoltaic device according to still another example embodiment of this invention. The FIG. 11 embodiment is similar to the FIG. 9-10 embodiments discussed above, except for the differences shown in the figure. FIG. 11 is a cross sectional view of a photovoltaic device according to an example embodiment of this invention. The photovoltaic device of the FIG. 11 may include: optional antireflective (AR) layer (not shown) on the light incident side of the front glass substrate 1; first dielectric layer 2a of or including one or more of silicon nitride (e.g., $Si_3N_4$ or other suitable stoichiometry), silicon oxynitride, silicon oxide (e.g., $SiO_2$ or other suitable stoichiometry), and/or tin oxide (e.g., $SnO_2$ or other suitable stoichiometry); second dielectric layer 2b of or including titanium oxide (e.g., $TiO_2$ or other suitable stoichiometry) and/or niobium oxide; third layer 2c (which may be a dielectric or a TCO) which may optionally function as a seed layer (e.g., of or including zinc oxide, zinc aluminum oxide, tin oxide, tin antimony oxide, indium zinc oxide, or the like) for the silver based layer 4c; conductive silver based IR reflecting layer 4c; overcoat or contact layer 4d (which may be a dielectric or conductive) of or including an oxide of Ni and/or Cr, NiCr, Ti, an oxide of Ti, zinc aluminum oxide, or the like; TCO 4e (e.g., including one or more layers) of or including zinc oxide, zinc aluminum oxide, tin oxide, tin antimony oxide, zinc tin oxide, indium tin oxide (ITO), indium zinc oxide, and/or zinc gallium aluminum oxide; optional buffer layer 4f which may be a TCO in certain instances (e.g., of or including zinc oxide, zinc aluminum oxide, tin oxide, tin antimony oxide, zinc tin oxide, indium tin oxide, indium zinc oxide, titanium oxide, or the like) and which may be conductive to some extent; semiconductor film 5 of or including one or more layers such as CdS/CdTe, a-Si, or the like (e.g., film 5 may be made up of a layer of or including CdS adjacent layer 4f, and a layer of or including CdTe adjacent layer 7); optional back contact/electrode/reflector 7 of aluminum or the like; optional adhesive 9 of or including a polymer such as PVB; and optional back/rear glass substrate 11. In certain example embodiments of this invention, dielectric layer 2a may be from about 10-20 nm thick, more preferably from about 12-18 nm thick; layer 2b may be from about 10-20 nm thick, more preferably from about 12-18 nm thick; layer 2c may be from about 5-20 nm thick, more preferably from about 5-15 nm thick (layer 2c is thinner than one or both of layers 2a and 2b in certain example embodiments); layer 4c may be from about 5-20 nm thick, more preferably from about 6-10 nm thick; layer 4d may be from about 0.2 to 5 nm thick, more preferably from about 0.5 to 2 nm thick; TCO film 4e may be from about 50-200 nm thick, more preferably from about 75-150 nm thick, and may have a resistivity of no more than about 100 mΩ in certain example instances; and buffer layer 4f may be from about 10-50 nm thick, more preferably from about 20-40 nm thick and may have a resistivity of no more than about 1 MΩ-cm in certain example instances. Moreover, the surface of glass 1 closest to the sun may be patterned via etching or the like in certain example embodiments of this invention.

Optional buffer layer 4f may provide substantial index matching between the semiconductor film 5 (e.g., CdS portion) to the TCO 4e in certain example embodiments, in order to optimize total solar transmission reaching the semiconductor.

Still referring to the FIG. 11 embodiments, semiconductor film 5 may include a single pin or pn semiconductor structure, or a tandem semiconductor structure in different embodiments of this invention. Semiconductor 5 may be of or include silicon in certain example instances. In other example embodiments, semiconductor film 5 may include a first layer of or including CdS (e.g., window layer) adjacent or closest to layer(s) 4e and/or 4f and a second semiconductor layer of or including CdTe (e.g., main absorber) adjacent or closest to the back electrode or contact 7.

Also referring to FIG. 11, in certain example embodiments, first dielectric layer 2a has a relatively low refractive index (n) (e.g., n of from about 1.7 to 2.2, more preferably from about 1.8 to 2.2, still more preferably from about 1.95 to 2.1, and most preferably from about 2.0 to 2.08), second dielectric layer 2b has a relatively high (compared to layer 2a) refractive index (n) (e.g., n of from about 2.2 to 2.6, more preferably from about 2.3 to 2.5, and most preferably from about 2.35 to 2.45), and third dielectric layer 2c may optionally have a relatively low (compared to layer 2b) refractive index (n) (e.g., n of from about 1.8 to 2.2, more preferably from about 1.95 to 2.1, and most preferably from about 2.0 to 2.05). In certain example embodiments, layers 2a-2c combine to form a good index matching stack for antireflection purposes and which also functions as a buffer against sodium migration from the glass 1. In certain example embodiments, the first dielectric layer 2a is from about 5-30 nm thick, more preferably from about 10-20 nm thick, the second dielectric layer 2b is from about 5-30 nm thick, more preferably from about 10-20 nm thick, and the third layer 2c is of a lesser thickness and is from about 3-20 nm thick, more preferably from about 5-15 nm thick, and most preferably from about 6-14 nm thick. While layers 2a, 2b and 2c are dielectrics in certain embodiments of this invention, one, two or all three of these layers may be dielectric or TCO in certain other example embodiments of this invention. Layers 2b and 2c are metal oxides in certain example embodiments of this invention, whereas layer 2a is a metal oxide and/or nitride, or silicon nitride in certain example instances. Layers 2a-2c may be deposited by sputtering or any other suitable technique.

Still referring to the FIG. 11 embodiment, the TCO layer(s) 4e may be of or include any suitable TCO including but not limited to zinc oxide, zinc aluminum oxide, tin oxide and/or the like. TCO layer or file 4e may include multiple layers in certain example instances. For example, certain instances, the TCO 4 includes a first layer of a first TCO metal oxide (e.g., zinc oxide) adjacent Ag 4c, Ag overcoat 4d and a second layer of a second TCO metal oxide (e.g., tin oxide) adjacent and contacting layer 4f and/or 5. The photovoltaic device of FIG. 11 may have a sheet resistance of no greater than about 18 ohms/square, more preferably no greater than about 15 ohms/square, even more preferably no greater than about 13 ohms/square in certain example embodiments of this invention. Moreover, the FIG. 11 embodiment may have tailored transmission spectra having more than 80% transmission into the semiconductor 5 in part or all of the wavelength range of from about 450-600 nm and/or 450-700 nm, where AM1.5 may have the strongest intensity, in certain example embodiments of this invention.

Examples 4-5 are discussed below, and each have a textured surface 1a of the front glass substrate 1 as shown in the figures herein. In Example 4, outer surface 1a of the front transparent glass substrate 1 was lightly etched having fine features that in effect function as a single layered low index antireflection coating suitable for, e.g., CdTe solar cell applications. Example 5 had larger features on the textured surface 1a of the front glass substrate, again formed by etching, that trap incoming light and refracts light into the semiconductor at oblique angles, suitable for, e.g., a-Si single and/or tandem solar cell applications. The interior surface 1b of the glass substrate 1 was flat in each of Examples 4 and 5, as was the front electrode 3.

Figure 12:
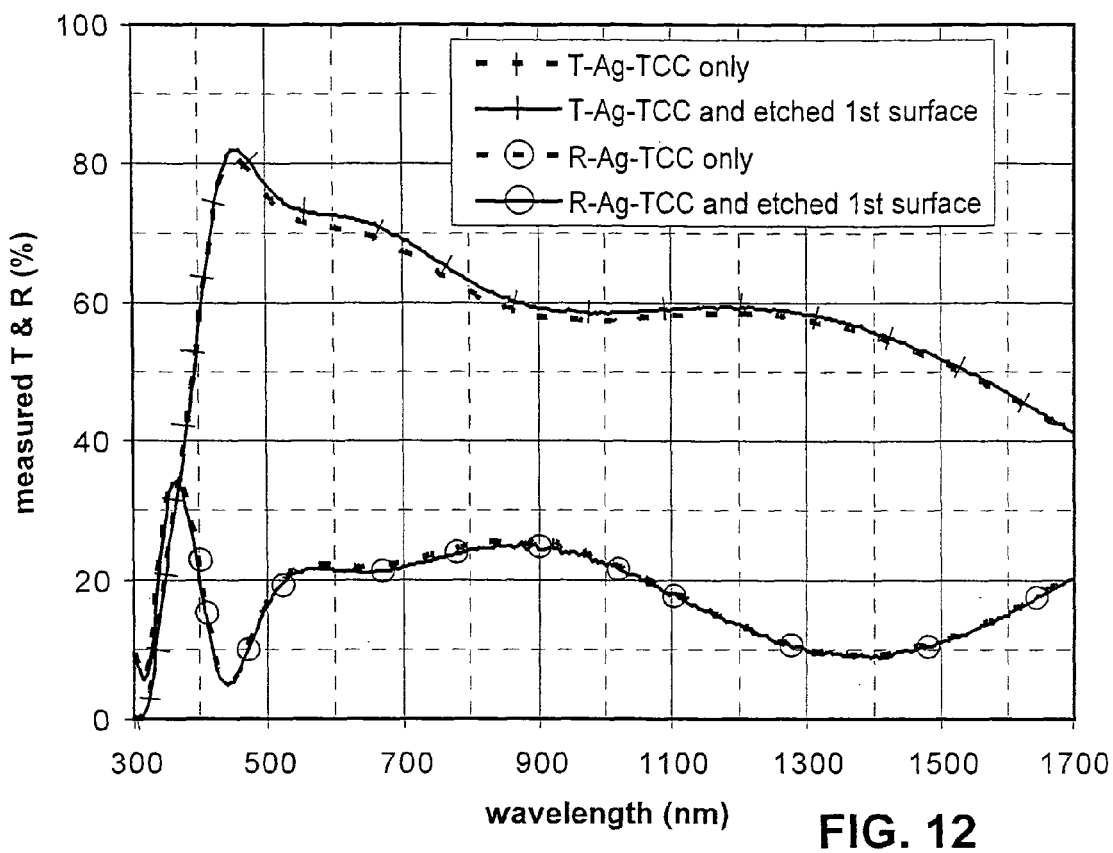
FIG. 12 is a measured transmission (T) and reflection (R) (% from first surface 1a) spectra, versus wavelength (nm), showing results from Example 4 (having a 10 ohms/sq. Ag-based TCC coating a front glass substrate with a textured surface).
Figure 13:
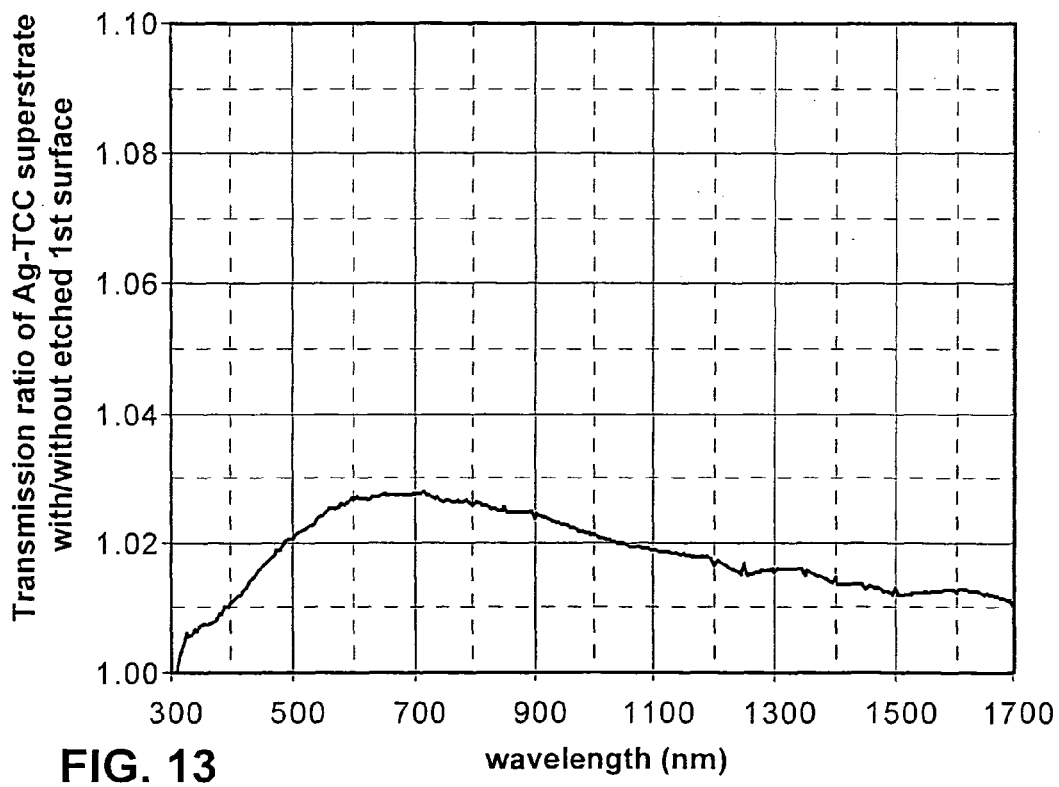
FIG. 13 is a transmission ratio versus wavelength (nm) graph illustrating results according to Example 4 (compared to a comparative example).
Figure 15:
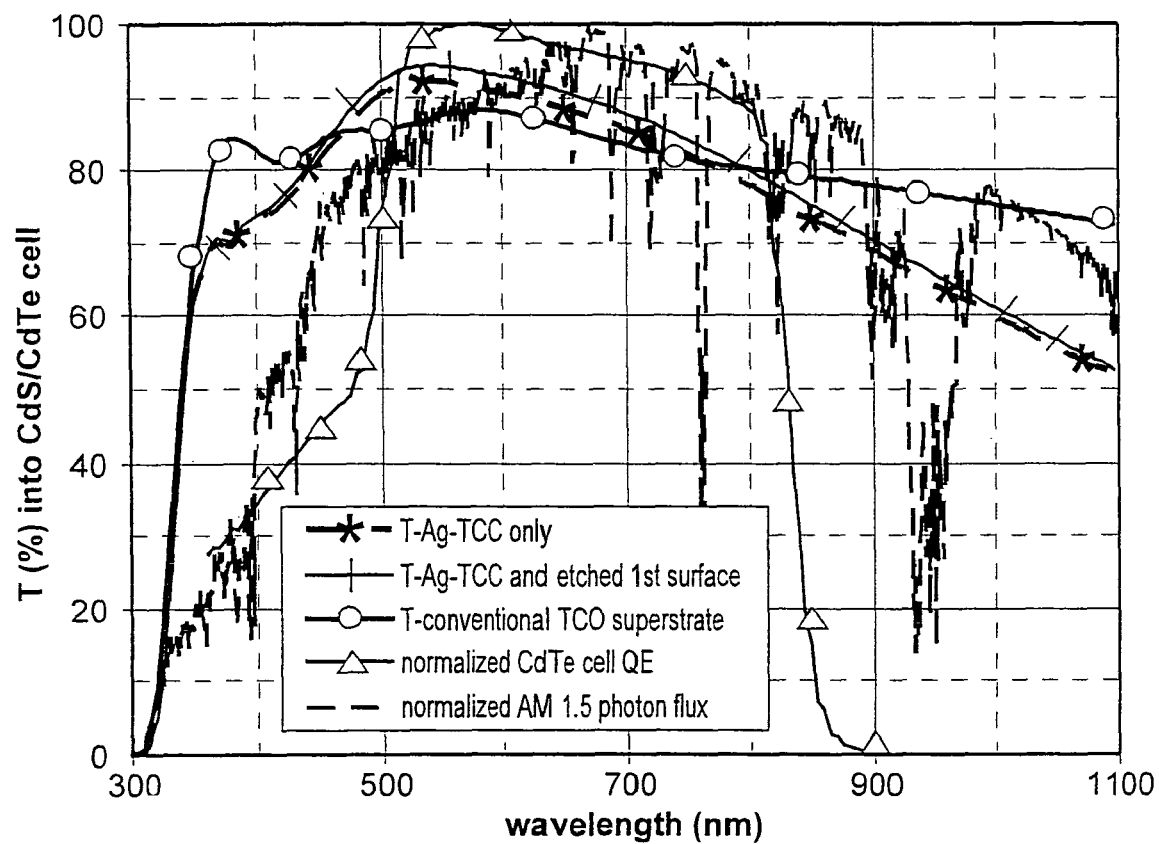
FIG. 15 is a percent transmission (T %) versus wavelength (nm) graph illustrating transmission spectra into a CdS/CdTe cell of a photovoltaic device comparing Example 4 of this invention (having a textured front surface of the front glass substrate) versus comparative examples; this shows that the Example 4 of this invention realized increased transmission in the approximately 500-700 nm wavelength range and thus increased photovoltaic module output power, compared to the comparative example without the etched front surface (x dotted line) and the comparative example of the conventional TCO superstrate (o solid line).

In Example 4, referring to FIG. 11, the layer stack moving from the glass 1 inwardly toward the semiconductor 5 was glass 1, silicon nitride (15 nm thick) layer 2a, TiO$_x$ (16 nm thick) layer 2b, ZnAlO$_x$ (10 nm thick) layer 2c, Ag (7 nm thick) layer 4c, NiCrO$_x$ (1 nm thick) layer 4d, ITO (110 nm thick) layer 4e, SnO$_x$ (30 nm thick) layer 4f, and then the CdS/CdTe semiconductor. The etched surface 1a of the front glass substrate 1 had an effective index and thickness around 1.35-1.42 and 110 nm, respectively. The etched surface 1a acted as an AR coating (although no such coating was physically present) and increased the transmission 2-3% which will be appreciated as being highly advantageous, around the wavelength region from 400-1,000 nm as shown in FIGS. 12-13. As shown in FIG. 15, the combination of the Ag-based TCC 3 and the textured front surface 1a resulted in enhanced transmission into the CdTe/CdS semiconductor film 5, especially in the region from 500-700 nm where CdTe PV device QE and solar flux are significant.

FIG. 12 is a measured transmission (T) and reflection (R) (% from first surface 1a) spectra, versus wavelength (nm), showing results from Example 4, where the example used a 10 ohms/sq. Ag-based TCC coating 3 a front glass substrate 1 with a textured surface 1. As explained above, the Example 4 with the textured surface 1a had slightly increased transmission (T) and slightly reduced reflection (R) in the 500-700 nm region compared to a comparative example shown in FIG. 12 where surface 1a (first surface) was not etched. This is advantage in that more current is generated in the semiconductor film 5 of the PV device. FIG. 15 is a percent transmission (T %) versus wavelength (nm) graph illustrating transmission spectra into a CdS/CdTe cell of a photovoltaic device comparing Example 4 versus comparative examples. FIG. 15 (predicted transmission into CdTe/CdS in a CdTe solar cell module of Example 4, having different front substrates) shows that the Example 4 realized increased transmission in the approximately 500-700 nm wavelength range and thus increased photovoltaic module output power, compared to the comparative example without the etched front surface (x dotted line) and the comparative example of the conventional TCO superstrate (o solid line).

Figure 14:
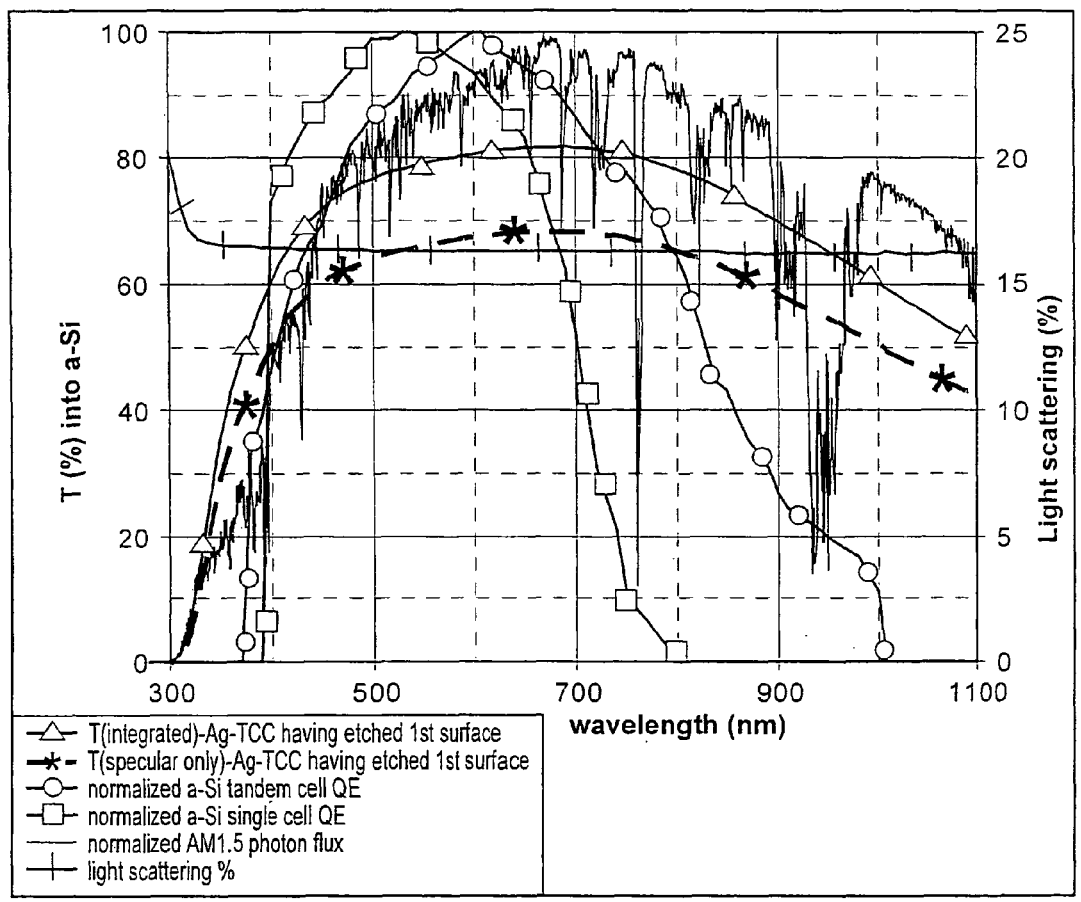
FIG. 14 is a percent transmission (T %) versus wavelength (nm) graph illustrating transmission spectra into an a-Si cell of a photovoltaic device, showing results of Example 5 of this invention having a textured front surface of the front glass substrate.

In Example 5, referring to FIG. 11, the layer stack moving from the glass 1 inwardly toward the semiconductor 5 was glass 1, silicon nitride (15 nm thick) layer 2a, TiO$_x$ (10 nm thick) layer 2b, ZnAlO$_x$ (10 nm thick) layer 2c, Ag (8 nm thick) layer 4c, NiCrO$_x$ (1 nm thick) layer 4d, ITO (70 nm thick) layer 4e, SnO$_x$ (20 nm thick) layer 4f, and then the a-Si semiconductor 5. FIG. 14 shows measured and predicted results; measured integrated and specular transmission spectra and predicted light scattering/diffusion, according to Example 5. FIG. 14 shows that the integrated transmission that includes both specular and diffused transmission lights is around 17% higher than the specular only transmission light. This implies that more than 17% of light in the visible and near-IR regions are either diffused or scattered. A diffused and/or scattered light has increased optical path in photovoltaic materials 5, and is especially desired in a-Si type solar cells.

Figure 16:
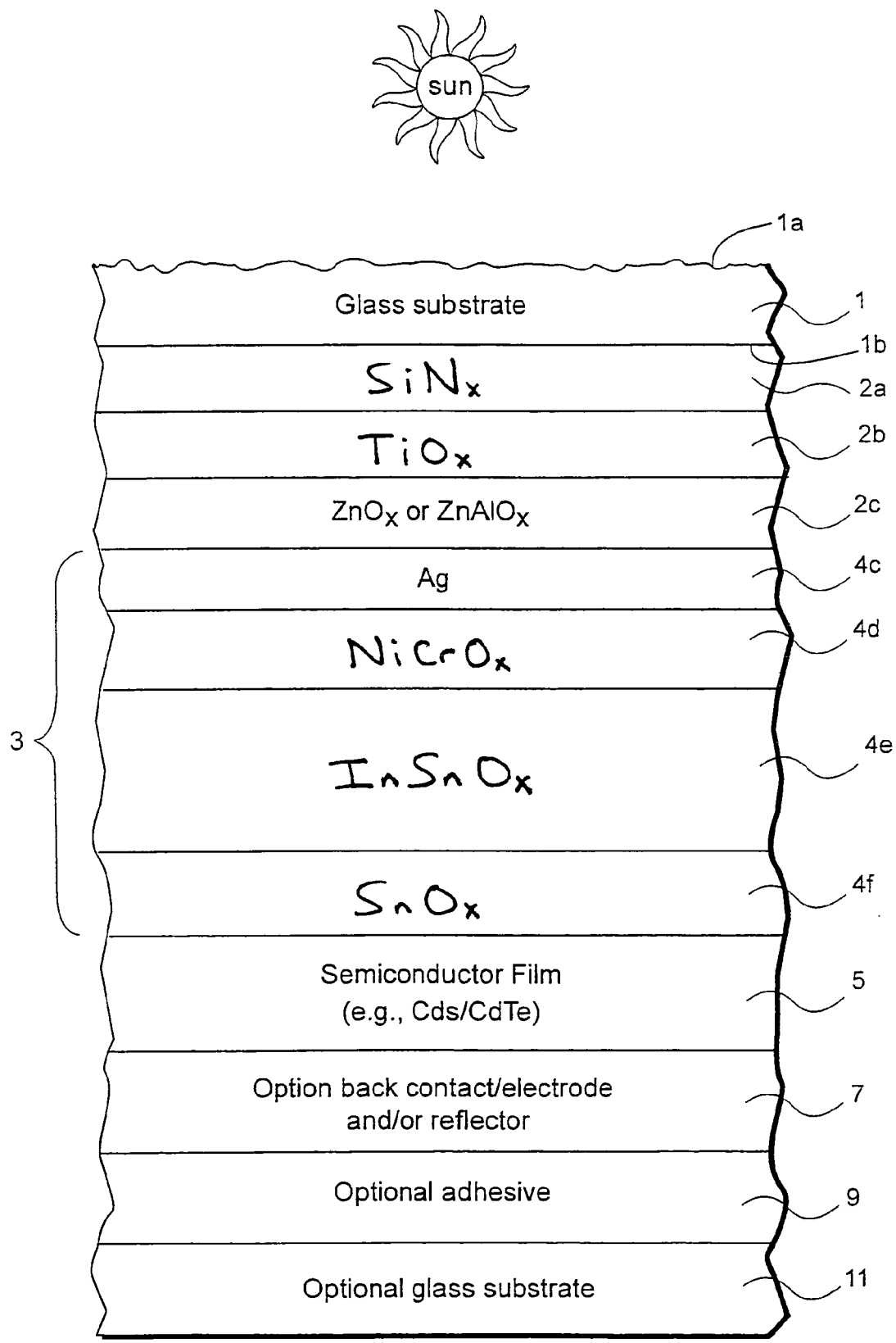
FIG. 16 is a cross sectional view of the photovoltaic device according to another example embodiment of this invention.

FIG. 16 is a cross sectional view of an example of the FIG. 11 embodiment of this invention. Solar radiation incident on photovoltaic solar cells includes two kinds of photons, short wavelength photons having energies high enough to create electron-hole pairs in photovoltaic materials and long wavelength photons having no contribution to electron-hole pair creation but generating thermal heat that degrades solar cell output power. Therefore, it is desired to have a transparent conductive superstrate (or front electrode/contact) that acts as not only a transparent conductive front contact but also a short pass filter that allows an increased amount of photons having high enough energy (such as in visible and near infra-red regions of the spectrum) into the active region or absorber of solar cells, and which also blocks the rest or a significant part of the rest of the incident solar radiation which may be harmful or undesirable. In this way, the solar cell output power can be improved due to reduced module temperature by increased IR reflection, and increased transmission in visible to near IR.

FIG. 16 is a cross sectional view illustrating an example design of such a conductive short pass filter as a front electrode, which achieves high transmission in visible and near IR but reflects long wavelength IR light. The thin Ag-based substantially metal layer 4c can be single Ag or Ag alloy, or sandwiched between other metallic layer such as TiNx, Ti or NiCr (not shown). The overall physical thickness of the front electrode in the FIG. 16 embodiment may be no more than 15 nm, and resistivity of this front electrode may be no more than 20 uohm-cm. The conductive oxide(s) can be single or multiple layered oxides of In, Sn, Zn, and their alloys with no more than 10% dopants such as Al, Ga, Sb and others in certain example embodiments. The overall conductive front electrode has an effective refractive index of no less than 1.85, and an optical thickness of from about 150-200, more preferably 160-190 nm, in certain example embodiments applicable to a-Si photovoltaic devices. The overall conductive front electrode has an effective refractive index of no less than 1.85, and an optical thickness of from about 240-300, more preferably 250-290 nm, in certain example embodiments applicable to CdS/CdTe photovoltaic devices. The overall sheet resistance of the conductive oxide layer is no more than 2000 ohm/sq. in certain example embodiments. The conductive oxide and Ag provide the required conductive path for electron/hole pairs generated from photovoltaic materials (e.g., semiconductor 5). The transparent base layer (2a, 2b) can be single or multiple layered oxide, oxynitride, or nitride, and it may be conductive or non-conductive. The transparent base layer (2a, 2b) has an overall effective index no less than 2.0 and optical thickness around 50-90 nm in certain example embodiments applicable to a-Si photovoltaic devices; and may have an overall effective index no less than 2.0 and optical thickness around 60-100 nm in certain example embodiments applicable to CdS/CdTe photovoltaic devices.

In certain example embodiments, the physical and/or optical thickness of layer 4e is at least two times thicker than that of layer 4f, more preferably at least 3 times thicker. Moreover, in certain example embodiments in connection with the FIG. 16 or other embodiments therein, layer 4f may have a refractive index (n) of from about 1.9 to 2.1, layer 4e may have a refractive index less than that of layer 4f, layer 4e may have a refractive index (n) of from about 1.8 to 2.0, layer 2c may have a refractive index of from about 1.8 to 2.05, more preferably from about 1.85 to 1.95, layer 2b may have a refractive index of from about 2.1 to 2.5, more preferably from about 2.25 to 2.45, and layer 2a may have a refractive index (n) of from about 1.9 to 2.1.

Examples 6-7 are set forth below, with reference to the FIG. 16 embodiment of this invention.

Figure 17:
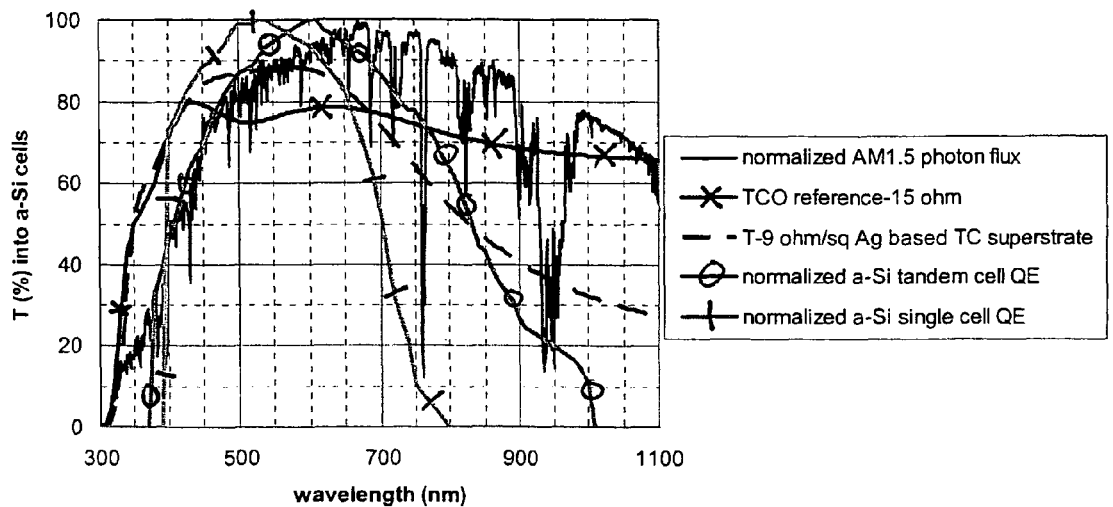
FIG. 17 is a percent transmission (T %) versus wavelength (nm) graph illustrating transmission spectra into an a-Si cell of a photovoltaic device comparing the FIG. 16 embodiment of this invention versus a comparative example; this shows that the FIG. 16 embodiment of this invention (e.g., T-9 curve in FIG. 17) realized increased transmission in the approximately 500-700 nm wavelength range and thus increased photovoltaic module output power, compared to the comparative example (X-marked curve in FIG. 17).

Example 6 relates to an a-Si based photovoltaic device. In Example 6, referring to FIG. 16 and using physical thickness values and refractive index values at about 550 nm, the layer stack moving from the glass 1 inwardly toward the semiconductor absorber film 5 was glass 1, silicon nitride (about 10-15 nm thick, e.g., about 15 nm thick; refractive index "n" of about 2.0) layer 2a, TiO$_x$ (about 10-20 nm thick, preferably about 10 nm; refractive index "n" of about 2.4) layer 2b, ZnO or ZnAlO$_x$ (about 5-15 nm thick, preferably about 10 nm thick, refractive index "n" of about 1.9-2.0) layer 2c, Ag (about 6-10 nm thick, preferably about 8 nm thick) layer 4c, NiCrO$_x$ or NiCr (about 1-3 nm thick) layer 4d, TCO ITO (indium tin oxide) (about 70 nm thick, refractive index "n" of about 1.9) layer 4e, TCO SnO$_x$ (about 20 nm thick, refractive index "n" of about 2.0) layer 4f, and then the a-Si or CdS/CdTe based semiconductor 5. The layers 4e and 4f in the FIG. 16 embodiment may be omitted in certain example embodiments, so that the NiCr based layer 4d contacts the semiconductor absorber 5. The FIG. 16 embodiment can be used in a CdTe type photovoltaic device in certain example embodiments of this invention. FIG. 17 shows the predicted results of transmission into the a-Si cell of this Example 6 device compared to a conventional front electrode consisting only of a tin oxide TCO on the glass substrate. In particular, FIG. 17 is a percent transmission (T %) versus wavelength (nm) graph illustrating transmission spectra for Example 6 into an a-Si cell, illustrating that Example 6 (e.g., T-9 curve in FIG. 17) realized increased transmission in the approximately 500-700 nm wavelength range and thus increased photovoltaic module output power, compared to the comparative example (X-marked curve in FIG. 17). Moreover, the FIG. 16-17 embodiment may have tailored transmission spectra having more than 80%, 85% or even 87% transmission into the semiconductor 5 in part of, the majority of, or all of the wavelength range of from about 450-600 nm and/or 450-700 nm, as shown in FIG. 17, in certain example embodiments of this invention.

Figure 18:
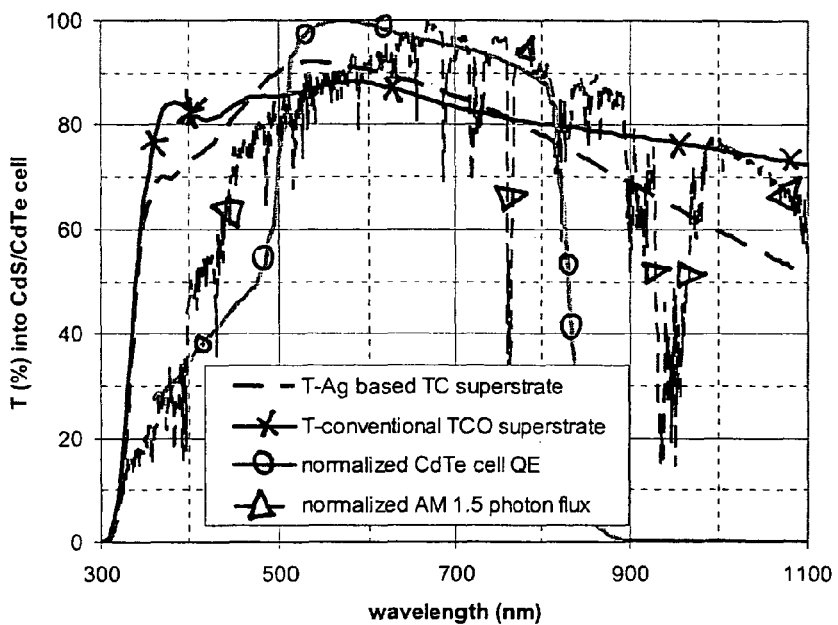
FIG. 18 is a percent transmission (T %) versus wavelength (nm) graph illustrating transmission spectra into a CdS/CdTe cell of a photovoltaic device comparing the FIG. 16 embodiment of this invention versus a comparative example; this shows that the FIG. 16 embodiment of this invention (e.g., T-Ag curve in FIG. 18) realized increased transmission in the approximately 500-700 nm wavelength range and thus increased photovoltaic module output power, compared to the comparative example (X-marked curve in FIG. 18).

Example 7 relates to a CdS/CdTe based photovoltaic device. In Example 7, referring to FIG. 16 and using physical thickness values and refractive index values at about 550 nm, the layer stack moving from the glass 1 inwardly toward the semiconductor absorber film 5 was glass 1, silicon nitride (about 15 nm thick, refractive index "n" of about 2.0) layer 2a, TiO$_x$ (about 16 nm thick, refractive index "n" of about 2.4) layer 2b, ZnAlO$_x$ (about 10 nm thick, refractive index "n" of about 1.9) layer 2c, Ag (about 7 nm thick) layer 4c, NiCrO$_x$ (about 1 nm thick) layer 4d, TCO ITO (indium tin oxide) (about 110 nm thick, refractive index "n" of about 1.9) layer 4e, TCO SnO$_x$ (about 30 nm thick, refractive index "n" of about 2.0) layer 4f, and then the a-Si based semiconductor 5. FIG. 18 shows the predicted results of incident transmission into the CdS/CdTe cell of this Example 7 device compared to a similar device including a conventional front electrode consisting only of a tin oxide TCO on the glass substrate. In particular, FIG. 18 is a percent transmission (T %) versus wavelength (nm) graph illustrating transmission spectra for Example 7 into a CdS/CdTe cell, illustrating that Example 7 (e.g., T-Ag curve in FIG. 18) realized increased transmission in the approximately 450-600 and 500-700 nm wavelength ranges and thus increased photovoltaic module output power, compared to the comparative example (X-marked curve in FIG. 18). Moreover, the FIGS. 16, 18 embodiment may have tailored transmission spectra having more than 85%, 90% or even 91 or 92% transmission into the semiconductor 5 in part of, the majority of, or all of the wavelength range(s) of from about 500-600 nm, 450-600 nm and/or 450-700 nm, as shown in FIG. 18, in certain example embodiments of this invention.

Figure 19A:
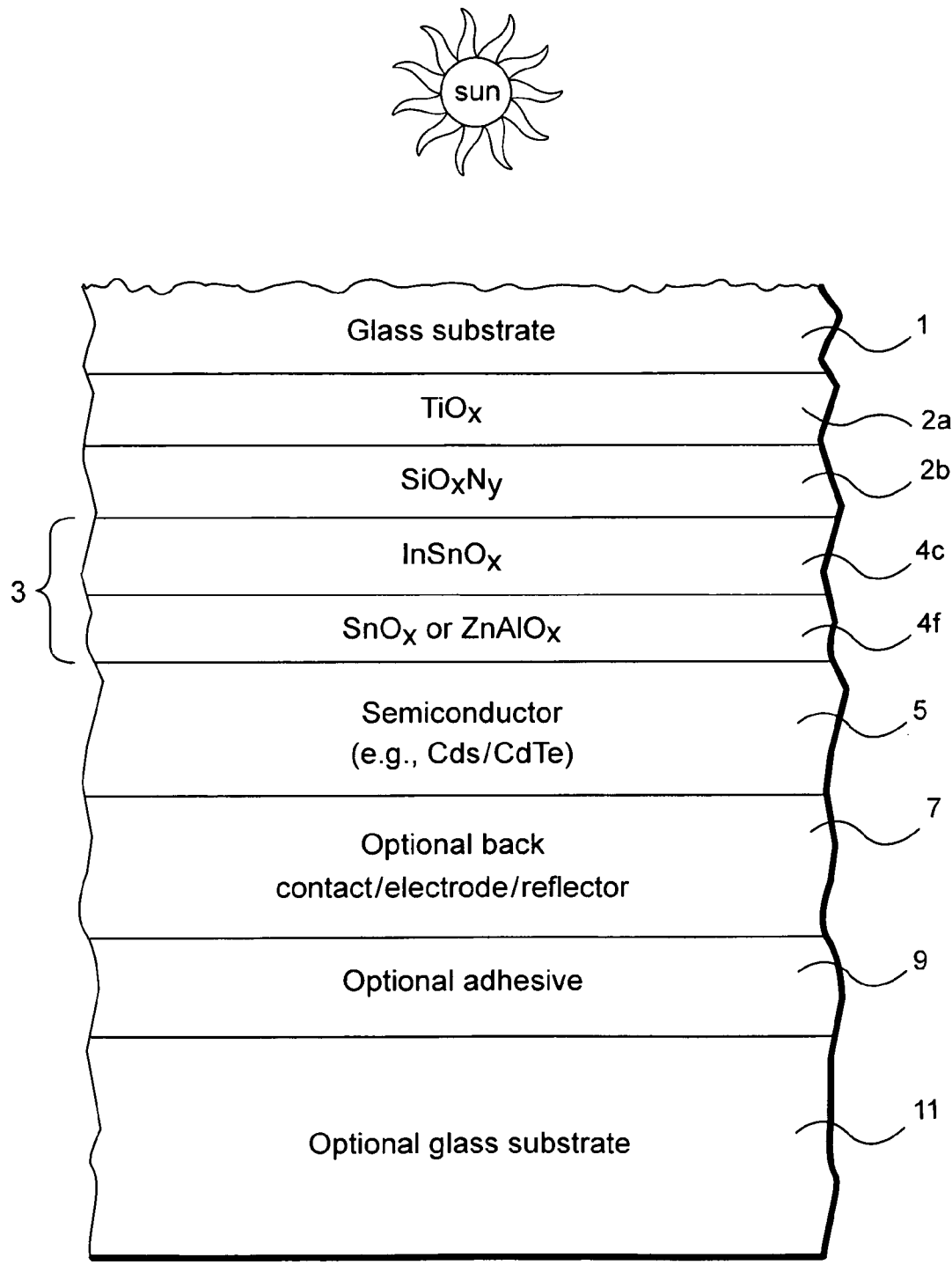
FIG. 19(a) is a cross sectional view of the photovoltaic device according to another example embodiment of this invention.
Figure 19B:
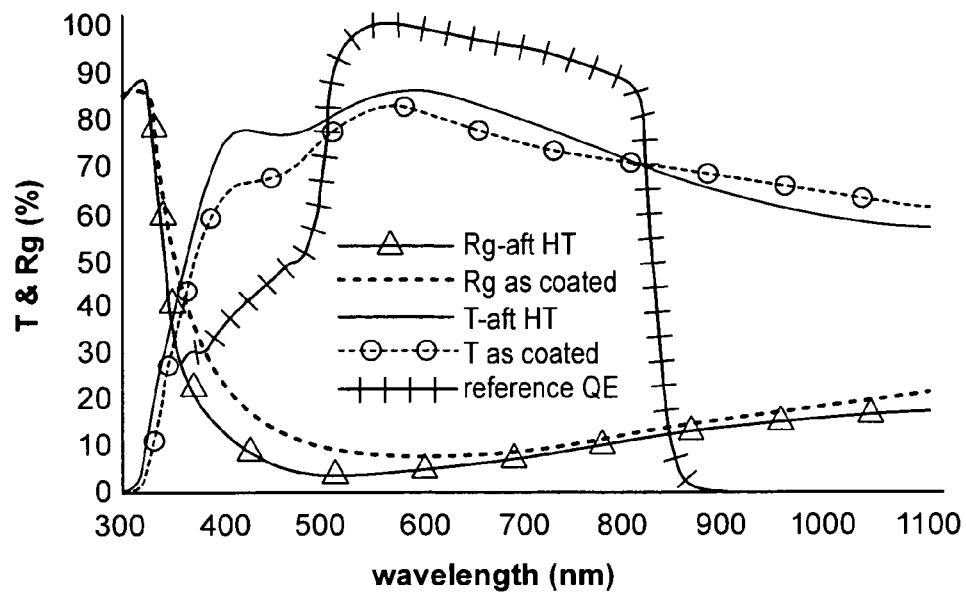
FIG. 19(b) is a wavelength vs transmission/reflection graph of Example 8.
Figure 19C:
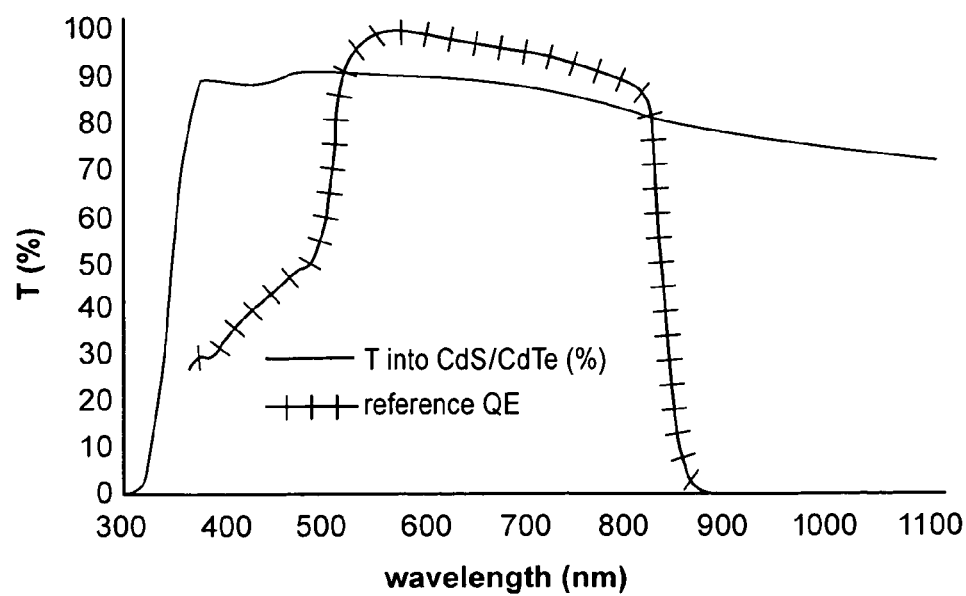
FIG. 19(c) is a wavelength vs transmission graph of Example 8.
Figure 20:
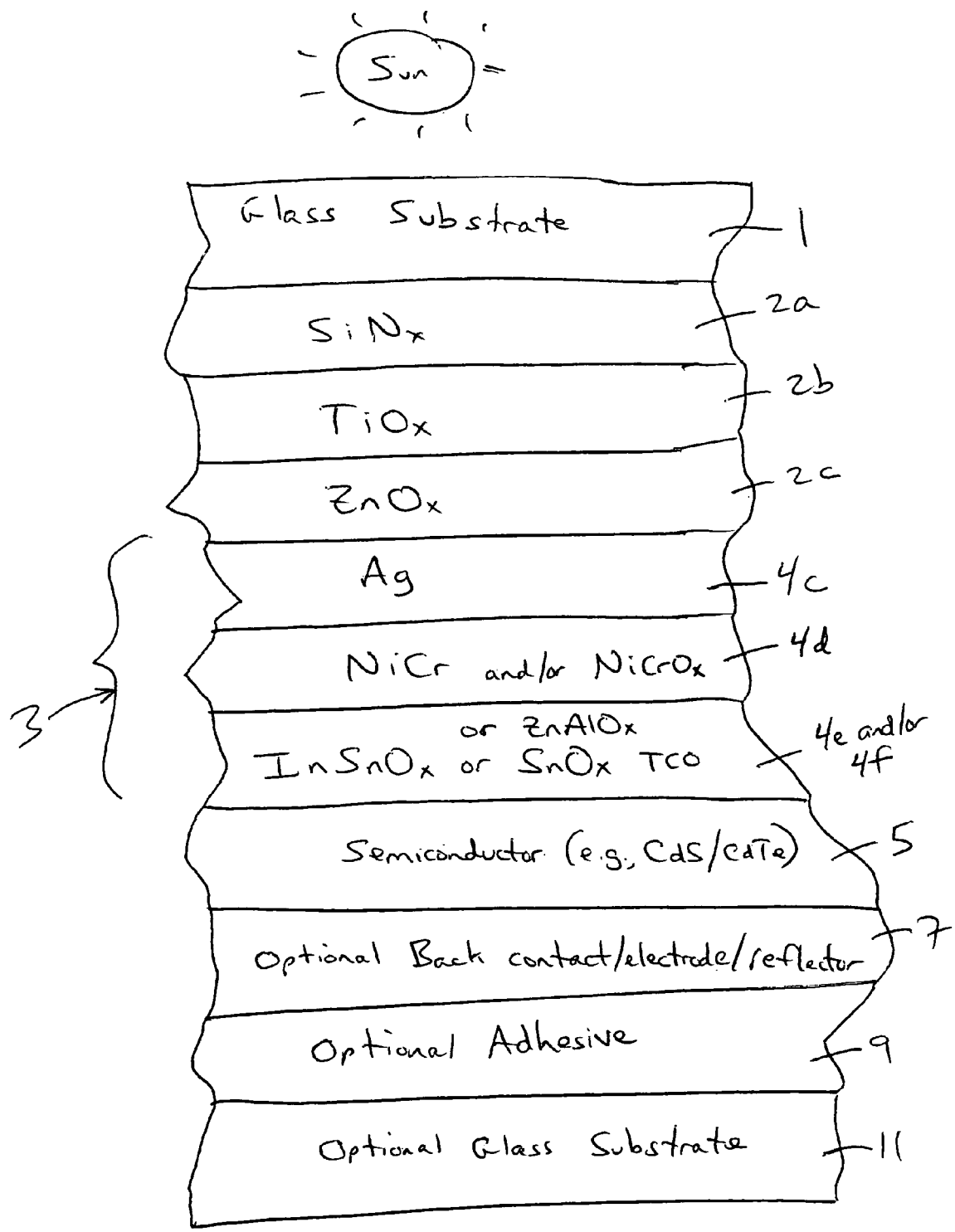
FIG. 20 is a cross sectional view of the photovoltaic device according to another example embodiment of this invention.

Example 8 relates to a CdS/CdTe type photovoltaic device, including an indium tin oxide based transparent conductive coating (TCC) (e.g., see FIGS. 19(a)-(c)). In Example 8, referring to FIG. 19(a) and using physical thickness values and refractive index values at about 550 nm, the layer stack moving from the glass 1 inwardly toward the semiconductor absorber film 5 was glass 1, dielectric $TiO_x$ (about 5-15 nm, preferably about 10 nm thick, refractive index "n" of about 2.3-2.4) layer 2a, dielectric silicon oxynitride (about 20-50 nm thick, preferably about 25-40 nm thick, refractive index "n" of from about 1.45-1.75, preferably from about 1.45-1.65) layer 2b, highly conductive indium tin oxide (ITO) layer 4c (e.g., from about 200-500 nm thick, more preferably from about 300-400 nm thick; resistivity of from about 0.2 to 0.5 mohm-cm, refractive index of from about 1.9 to 2.1), TCO $SnO_x$ (about 20-80 nm thick, more preferably from about 30-60 nm thick; refractive index "n" of about 1.9-2.0) layer 4f, and then CdS/CdTe semiconductor film 5, back contact/electrode 7, optional adhesive 9, and rear glass substrate 11. This embodiment includes a transparent conductive superstrate structure including the highly conductive ITO based layer 4c sandwiched between a low conductive layer 4f atop and a non-conductive dielectric layer (2a and/or 2b) thereunder on the substrate 1. This coating has a low sheet resistance and high transmission in the visible to near IR that is suitable for applications as transparent conductive superstrates in thin film solar cell modules.

Fluorine doped pyrolytic tin oxide is widely used as a TCC in coatings for solar cells. A physical thickness of 350-700 nm associated with more than 10% absorption loss is needed to achieve 10-15 ohm/square sheet resistance in this respect. Comparing to fluorine doped tin oxides, ITO thin films have lower absorption loss and higher conductivity. A reduced absorption loss in visible to near IR allowed increased light impinging into the semiconductor film 5 that results in increased photocurrents. An increased conductivity reduces required physical thicknesses to achieve desired sheet resistance that has direct impact to the manufacturing cost as well as overall absorption loss. The increased conductivity also reduces current loss in a module that improves the total output power. Therefore, the use of ITO is better than F-doped tin oxide for the main conductor of the front electrode of a PV device.

In the FIG. 19(a) embodiment, the $TiO_x$ based dielectric layer 2a and the silicon oxynitride based dielectric layer 2b together provide dual roles as an index matching film to reduce reflection loss from the front surface of the device and as a barrier layer to block diffusion of undesired elements from the glass 1 such as reducing or preventing diffusion of sodium from glass 1 into the ITO layer 3c and/or semiconductor film 5. The low conductive metal oxide based layer 4f (of or including tin oxide and/or zinc oxide and/or zinc aluminum oxide) in the FIG. 19(a) embodiment acts as a buffer layer to reduce shunting risk caused by pinholes on the CdS of the semiconductor 5. FIG. 19(b) shows measured optical transmission and reflection before and after the exposure of the Example 8 coating (elements 1, 2 and 4 in FIG. 19(a)) to elevated temperature(s) (heat treatment of HT) similar to CdTe solar cell processing temperatures. The exposure to elevated temperature(s) reduces absorption loss as shown in FIG. 19(b), as well as sheet resistance of the coating to less than 15 ohms/square as compared to the as-deposited value of 75 ohms/square. FIG. 19(c) shows the estimated light impinging into the CdS/CdTe film photovoltaic material 5 when the ITO based coating (layers 1, 2 and 4 in FIG. 19(a)) of Example 8 is used as the superstrate. As short circuit current density of 24.6 mA/cm$^2$ was achieved from a 2'×4' CdTe solar cell panel using this ITO based transparent conductive superstrate.

Example 9 is similar to that of Example 8 discussed above, except that it is applicable to amorphous and/or microcrystalline silicon and silicon alloys based single and/or tandem junction thin film solar cells (still referring to FIG. 19(a)). In Example 9, referring to FIG. 19(a), and using physical thickness values and refractive index values at about 550 nm, the layer stack moving from the glass 1 inwardly toward the semiconductor absorber film 5 was glass 1, dielectric $TiO_x$ (about 5-15 nm, preferably about 10 nm thick, refractive index "n" of about 2.3-2.4) layer 2a, dielectric silicon oxynitride (about 20-50 nm thick, preferably about 25-40 nm thick, refractive index "n" of from about 1.45-1.75, preferably from about 1.45-1.65) layer 2b, highly conductive indium tin oxide (ITO) layer 4c (e.g., from about 100-500 nm thick, more preferably from about 150-250 nm thick; resistivity of from about 0.2 to 0.5 mohm-cm, refractive index of from about 1.9 to 2.1), TCO $ZnAlO_x$ (at least about 30 nm thick, more preferably from about 30-150 nm thick; refractive index "n" of about 1.9-2.2) layer 4f, and then silicon based semiconductor film 5, back contact/electrode 7, optional adhesive 9, and rear glass substrate 11. This embodiment includes a transparent conductive superstrate structure including the highly conductive ITO based layer 4c sandwiched between a low conductive layer 4f atop and a non-conductive dielectric layer (2a and/or 2b) thereunder on the substrate 1. This coating has a low sheet resistance and high transmission in the visible to near IR that is suitable for applications as transparent conductive superstrates in thin film solar cell modules. The ITO layer 4c plays the major role to provide the desired conduction for the solar cell module. The ZnAlOx layer 4f has multiple functionalities such as (i) protecting the ITO 4c from reduction caused by high hydrogen plasma during silicon deposition for layer 5, (ii) trapping light through a roughened ZnAlOx surface created during deposition or post-deposition treatment such as via etching or laser patterning, and (iii) providing supplementary conduction to the ITO and a good ohmic contact to the silicon based p-layer of film 5.

In the embodiments of Examples 8 and 9 (the FIG. 19(a) embodiments), the $TiO_x$ based dielectric layer 2a and the silicon oxynitride based dielectric layer 2b bi-layer stack can be replaced by a single layer having an index of from about 1.6 to 1.8, more preferably from about 1.65 to 1.75 (e.g., a silicon oxynitride layer), a high-low index alternating multiple layer stack, or a graded index layer (e.g., graded silicon oxynitride) having an index less than about 1.6 on the side closest to glass 1 and at least 1.7 on the side farthest from glass 1 (on the ITO side). For layer 4f, the tin oxide in Ex. 8 and the zinc oxide in Ex. 9 can be replaced by other transparent conductive materials such as indium oxide, and alloys thereof with or without dopants such as Al, Ga and/or Sb.

Figure 21:
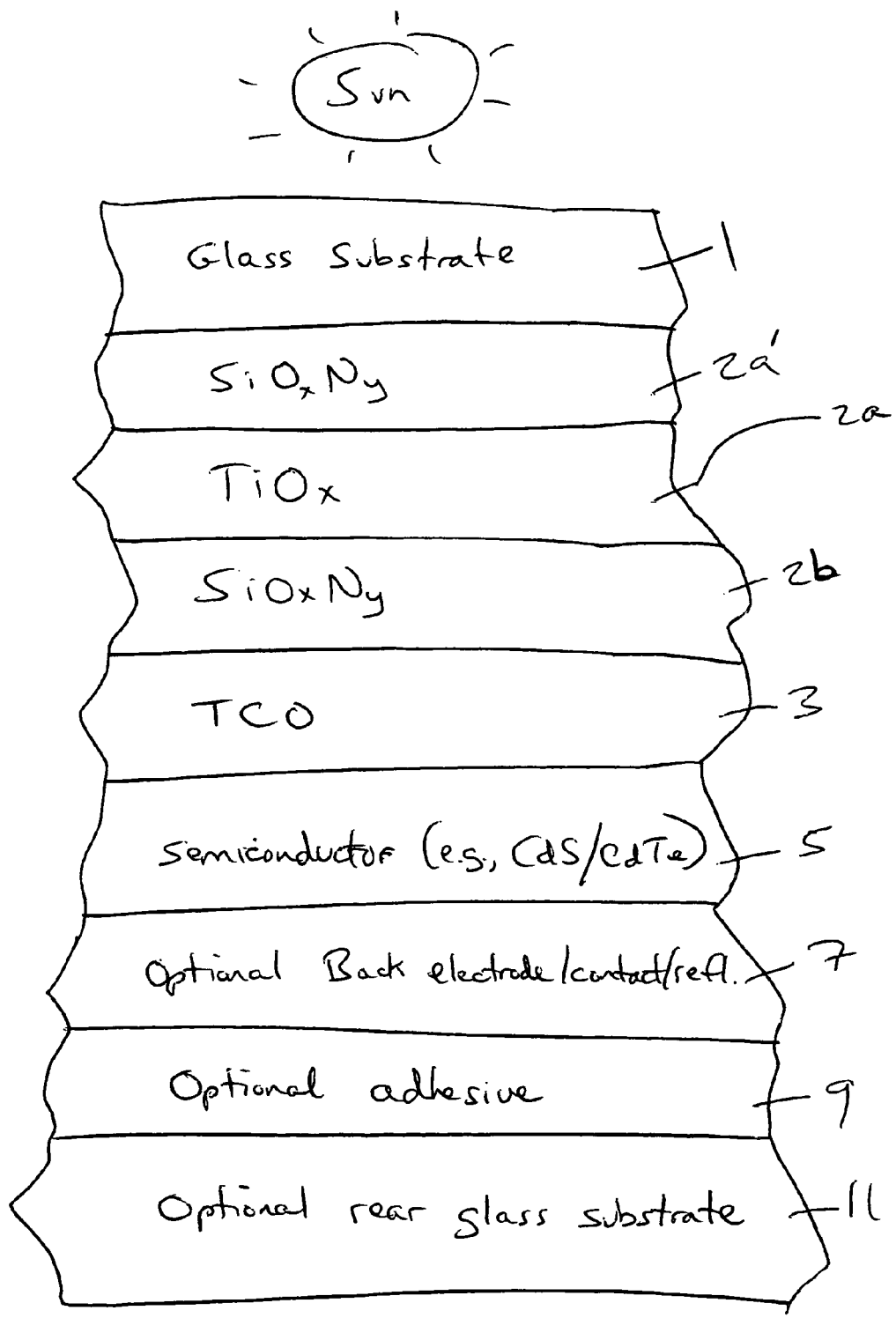
FIG. 21 is a cross sectional view of the photovoltaic device according to another example embodiment of this invention.

FIG. 21 illustrates another example embodiment of this invention. The FIG. 21 embodiment is the same as the FIG. 19(a)-(c) embodiment discussed above, except that an additional dielectric silicon oxynitride layer 2a' is provided in the dielectric stack between the glass 1 and the conductive electrode coating 3. The additional silicon oxynitride layer 2a' in the FIG. 21 embodiment provides for additional index matching to reduce reflection loss from the front surface of the device and additional barrier functionality to block diffusion of undesired elements from the glass 1 such as reducing or preventing diffusion of sodium from glass 1 into the ITO layer 3c and/or semiconductor film 5 during heat treatment or otherwise. The sheet resistance of such a coating may be from about 20-30 ohms/square as deposited in certain example instances, in an example where the TCO 3 is from about 30-140 nm thick, the titanium oxide based layer 2a is from about 10-20 nm thick, and the silicon oxynitride layer(s) are each from about 10-400 nm thick.

Figure 22:
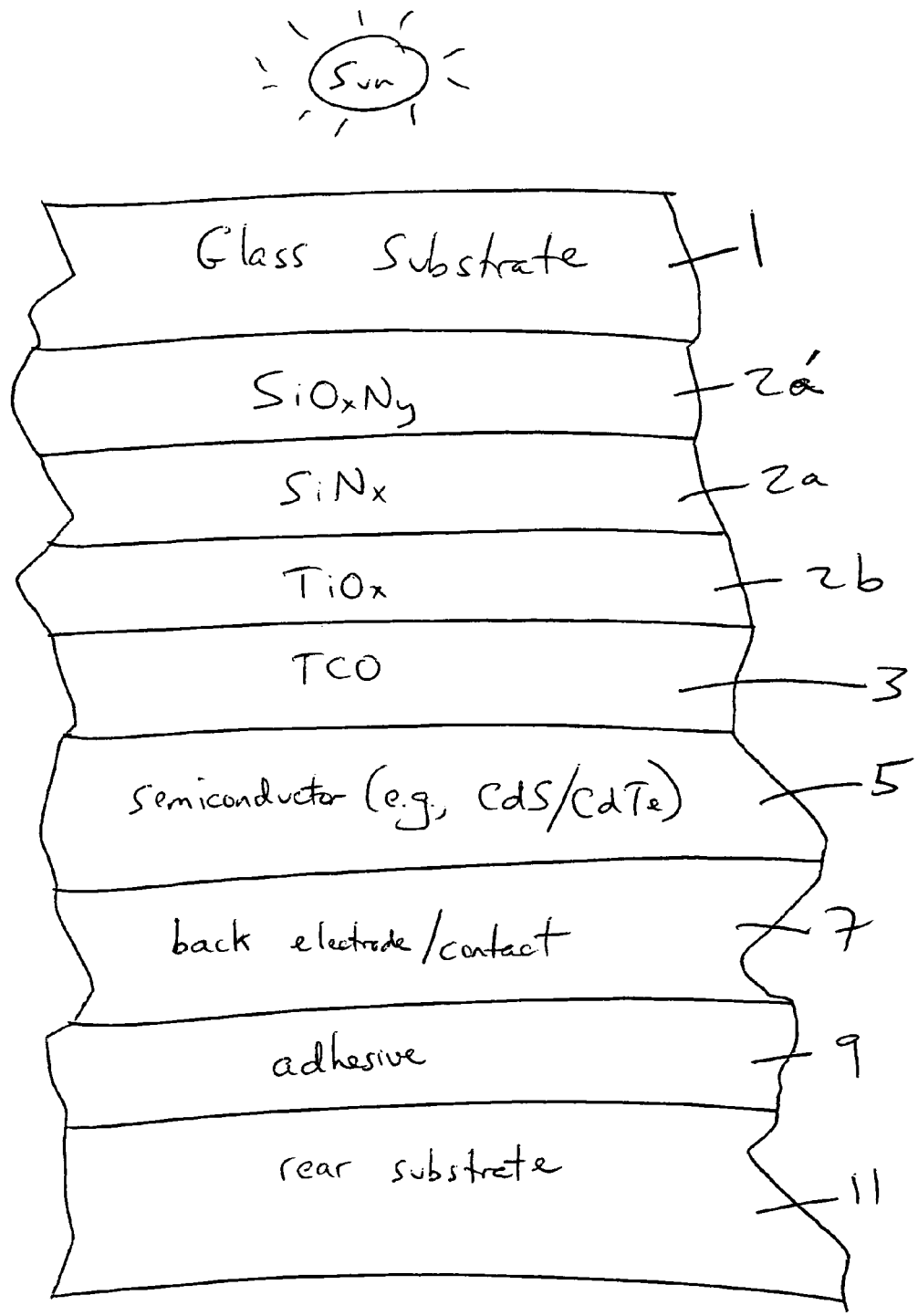
FIG. 22 is a cross sectional view of the photovoltaic device according to another example embodiment of this invention.

FIG. 22 illustrates another example embodiment of this invention. The FIG. 22 embodiment is the same as the FIG. 19(a)-(c) embodiment discussed above, except that the dielectric layer stack between the TCO (e.g., Ag based coating, as in any embodiment herein) 3 and the glass 1 is made up of silicon oxynitride layer 2a', silicon nitride (e.g., $Si_3N_4$ or a substoichiometric Si-rich type of silicon nitride) layer 2a, and titanium oxide based layer 2b. The oxidation graded silicon nitride based film 2a/2a' in the FIG. 22 embodiment provides for good index matching while at the same time is a good blocker of sodium diffusion from the glass 1 toward the ITO. The sheet resistance of such a coating may be from about 20-30 ohms/square as deposited in certain example instances, in an example where the TCO 3 is from about 30-140 nm thick, the titanium oxide based layer 2b is from about 10-20 nm thick, the silicon nitride based layer 2a is from about 10-15 nm thick and the silicon oxynitride based layer 2a' is from about 10-400 nm thick.

As a modification of the FIG. 22 embodiment, the TCO 3 in FIG. 22 may be of or based on ITO, and the layers 2a and 2b can be removed, leaving a structure of glass/SiON/ITO as the front electrode structure. In such an embodiment, the refractive index (n) of the silicon oxynitride can be from about 1.5 to 1.9 or 2.0, more preferably from about 1.6 to 1.8. Alternatively, as another modification of the FIG. 22 embodiment, the TCO 3 in FIG. 22 may be of or based on ITO and the titanium oxide layer 2b can be removed, leaving a structure of glass/SiON/SiNx/ITO as the front electrode structure. In such an embodiment, the silicon nitride layer may have a refractive index of about 2.0. As yet another modification of the FIG. 22 embodiment, the TCO 3 in FIG. 22 may be of or based on an Ag-based coating of any embodiment herein and the silicon nitride layer 2a can be removed, leaving a structure of glass/SiON/TiOx/TCO as the front electrode structure. In such an embodiment, the refractive index (n) of the silicon oxynitride 2a' can be from about 1.5 to 1.9 or 2.0, more preferably from about 1.6 to 1.8. Alternatively, in FIG. 22 both layers 2a' and 2a can be removed in certain alternative embodiments. As with all other embodiments herein, the silicon nitride (layer 2a) may be of the Si-rich type (e.g., $Si_xN_y$, where the x/y ratio is from about 0.76 to 1.2, more preferably from about 0.82 to 1.1), where absorption loss due to Si-rich nature of the silicon nitride based layer can be reduced after cell processing so keep absorption loss low.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A photovoltaic device including a front electrode structure, the front electrode structure comprising:
    a front substantially transparent glass substrate;
    a dielectric layer comprising titanium oxide;
    a dielectric layer comprising silicon oxynitride, wherein the layer comprising titanium oxide is located between the glass substrate and the layer comprising silicon oxynitride;
    a conductive layer comprising indium tin oxide, wherein the layer comprising silicon oxynitride is located between and contacting at least the layer comprising indium tin oxide and the layer comprising titanium oxide;
    a conductive layer comprising at least one of zinc oxide, tin oxide, and/or zinc aluminum oxide, wherein the conductive layer comprising indium tin oxide is located between and directly contacting the layer comprising silicon oxynitride and the conductive layer comprising at least one of zinc oxide, tin oxide, and/or zinc aluminum oxide;
    wherein the front electrode structure comprising said layer comprising titanium oxide, said layer comprising silicon oxynitride, said conductive layer comprising indium tin oxide, and said conductive layer comprising at least one of zinc oxide, tin oxide, and/or zinc aluminum oxide, is provided on an interior surface of the front glass substrate facing a semiconductor film of the photovoltaic device.

2. The photovoltaic device of claim 1, further comprising another layer comprising silicon oxynitride and/or silicon nitride between the glass substrate and the layer comprising titanium oxide.

3. The photovoltaic device of claim 1, wherein an exterior surface of the glass substrate is etched, but the interior surface of the glass substrate on which the layer stack is provided is not etched and is substantially flat.

4. The photovoltaic device of claim 1, wherein the semiconductor film comprises silicon, and the front electrode structure has a transmission of at least 85% in at least a majority of a range of from 450-700 nm.

5. The photovoltaic device of claim 1, wherein the semiconductor film comprises silicon, and the front electrode structure has a transmission of at least 87% in at least part of a range of from 450-700 nm.

6. The photovoltaic device of claim 1, wherein the semiconductor film comprises CdS and/or CdTe, and the front electrode structure has a transmission of at least 90% in at least a majority of a range of from 500-600 nm.

7. The photovoltaic device of claim 1, wherein the semiconductor film comprises CdS and/or CdTe, and the front electrode structure has a transmission of at least 92% in at least part of a range of from 500-600 nm.

8. The photovoltaic device of claim 1, wherein the semiconductor film contacts the conductive layer comprising at least one of zinc oxide, tin oxide, and/or zinc aluminum oxide.

9. The photovoltaice device of claim 8, wherein the semiconductor film comprises CdS and/or CdTe.

* * * * *